US008895840B2

(12) United States Patent
Suto

(10) Patent No.: US 8,895,840 B2
(45) Date of Patent: Nov. 25, 2014

(54) PHOTOELECTRIC CONVERSION DEVICE

(75) Inventor: Hiroyuki Suto, Numazu (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 127 days.

(21) Appl. No.: 13/383,489

(22) PCT Filed: Jul. 23, 2009

(86) PCT No.: PCT/JP2009/063179
§ 371 (c)(1),
(2), (4) Date: Jan. 11, 2012

(87) PCT Pub. No.: WO2011/010379
PCT Pub. Date: Jan. 27, 2011

(65) Prior Publication Data
US 2012/0111398 A1    May 10, 2012

(51) Int. Cl.
*H01L 31/06*    (2012.01)
*H01L 31/02*    (2006.01)
*H01L 31/075*    (2012.01)
*H01L 31/0352*    (2006.01)

(52) U.S. Cl.
CPC ...... *H01L 31/075* (2013.01); *H01L 31/035218* (2013.01); *Y02E 10/548* (2013.01); *Y10S 977/932* (2013.01); *Y10S 977/948* (2013.01)
USPC ............................ 136/255; 977/932; 977/948

(58) Field of Classification Search
CPC ............... H01L 31/035209; H01L 31/035236; H01L 31/101
USPC ............ 136/255, 258; 257/441; 977/932, 948
See application file for complete search history.

(56) References Cited

U.S. PATENT DOCUMENTS 7,750,425 B2 *    7/2010    Forrest et al. ................. 257/441
2007/0137693 A1    6/2007    Forrest (Continued)

FOREIGN PATENT DOCUMENTS

GB    WO2009044171    *    4/2009    .................. 136/256
JP    8-264825        10/1996

(Continued)

OTHER PUBLICATIONS

International Search Report in International Application No. PCT/JP2009/063179; Mailing Date: Oct. 6, 2009.

(Continued)

*Primary Examiner* — Jonathan Johnson
*Assistant Examiner* — Bethany Lambright
(74) *Attorney, Agent, or Firm* — Finnegan, Henderson, Farabow, Garrett & Dunner, LLP

(57) ABSTRACT

A main object of the present invention is to provide a photoelectric conversion device which is capable of improving the photoelectric conversion efficiency. The invention comprises: a p-layer; an n-layer; an i-layer disposed between the p-layer and the n-layer; a first electrode connected to the p-layer; and a second electrode connected to the n-layer, wherein the i-layer comprises a wall layer constituted by a first semiconductor, and a quantum structure portion constituted by a second semiconductor disposed in the wall layer; a band gap of the first semiconductor is wider than that of the second semiconductor; when a concentration of the n-type impurity that may be contained in the middle of the i-layer in a thickness direction thereof is defined as $Cn1$, a concentration of the n-type impurity that may be contained in the region on the p-layer side of the i-layer is defined as $Cn2$, a concentration of the p-type impurity that may be contained in the middle of the i-layer in a thickness direction thereof is defined as $Cp1$, and a concentration of the p-type impurity that may be contained in the region on the n-layer side of the i-layer is defined as $Cp2$, the relations $Cn1<Cn2$ and/or $Cp1<Cp2$ are satisfied.

11 Claims, 14 Drawing Sheets

(56) References Cited

U.S. PATENT DOCUMENTS

| | | | |
|---|---|---|---|
| 2007/0151592 A1* | 7/2007 | Forrest et al. | 136/243 |
| 2007/0215858 A1 | 9/2007 | Uchiyama et al. | |
| 2010/0218819 A1* | 9/2010 | Farmer et al. | 136/256 |

FOREIGN PATENT DOCUMENTS

| | | |
|---|---|---|
| JP | 2006-114815 | 4/2006 |
| JP | 2007-250648 | 9/2007 |
| JP | 4066994 | 1/2008 |
| JP | 2008-91427 | 4/2008 |
| JP | 2008-227323 | 9/2008 |
| JP | 2009-520357 | 5/2009 |

OTHER PUBLICATIONS

E.E. Mendez et al., "Stark Localization in GaAs-GaAlAs Superlattices Under an Electric Field", Physical Review Letters, vol. 60, No. 23, pp. 2426-2429 (Jun. 6, 1988).

P. Voisin et al., "Observation of the Wannier-Stark Quantization in a Semiconductor Superlattice", Physical Review Letters, vol. 61, No. 14, pp. 1639-1642 (Oct. 3, 1988).

G. Wei et al., "Intermediate-Band Solar Cells Employing Quantum Dots Embedded in an Energy Fence Barrier", Nano Letters, vol. 7, No. 1, pp. 218-222 (2007).

* cited by examiner

PHOTOELECTRIC CONVERSION DEVICE

CROSS-REFERENCE TO RELATED APPLICATIONS

This application is a national phase application of International Application No. PCT/JP2009/063179, filed Jul. 23, 2009, the contents of which are incorporated herein by reference.

TECHNICAL FIELD

The present invention relates to a photoelectric conversion device; and particularly relates to a photoelectric conversion device employing the quantum structure.

BACKGROUND ART

A Solar cell has advantages that the amount of carbon dioxide emitted per power generation is small and that no fuels for power generation is required. Thus, studies on various types of solar cells have been actively developed. Currently, among the solar cells in practical use, a mono-junction solar cell having a set of p-n junction and using single-crystal silicon or polycrystal silicon has become mainstream. However, the theoretical limit of the photoelectric conversion efficiency of the mono-junction solar cell (hereinafter, referred to as a "theoretical efficiency limit".) remains at about 30%; therefore, new methods for further improving the theoretical efficiency limit have been studied.

One of the new methods which have been studied so far is a solar cell employing a quantum structure of a semiconductor. Known examples of the quantum structure used for this type of solar cell include a quantum dot, quantum well, and quantum wire. By employing the quantum structure, it is possible to absorb a bandwidth of the solar spectrum which cannot be absorbed by a conventional solar cell. Therefore, it is assumed that with a solar cell employing the quantum structure, the theoretical efficiency limit can be improved up to 60% or more.

As a technique related to such a solar cell (including an optical semiconductor device), for example, Patent Document 1 discloses an optical semiconductor device wherein a semiconductor light-emitting/receiving element comprises as its light-emitting/receiving layer, a plurality of layers comprising a quantum dot made of a semiconductor and having a cross-sectional size of approximately the de Broglie wavelength of the electrons; and comprising a semiconductor surrounding the quantum dot and having a potential energy higher than that of the quantum dot to function as an energy barrier. Further, Patent document 2 discloses a solar cell formed by a p-i-n structure, and comprising a quantum dot which has a three-dimensional confinement effect in an i-layer as a photodetecting layer, wherein the energy band structure of the quantum dot and the barrier layer surrounding the quantum dot is a Type-II; a layer for preventing injection of a carrier which serves as a barrier for preventing injection of a hole into the quantum dot, is formed on an n-layer side of the quantum dot; and a layer for preventing injection of a carrier which serves as a barrier for preventing injection of an electron into the quantum dot, is formed on a p-layer side of the quantum dot.

CITATION LIST

Patent Literatures

Patent Document 1: Japanese Patent Application Laid-Open (JP-A) No. 08-264825
Patent Document 2: JP-A No. 2006-114815

Non-Patent Literatures

Non-Patent Document 1: E. E. Mendez, et al., Physical Review Letters 60, 2426 (1988)
Non-Patent Document 2: P. Voisin, et al., Physical Review Letters 61, 1639 (1988)

SUMMARY OF THE INVENTION

Technical Problems

In a p-i-n-type solar cell (i.e. a solar cell having a p-i-n junction) employing the quantum structure, whereas an electron and hole, (which may be collectively referred to as a "carrier", hereinafter) generated in the quantum structure are transferred among the quantum structures mainly by tunneling conduction, it is often assumed that the electron and hole are thermally excited from the quantum structure closest to an electrode to an n-layer or a p-layer. Here, as described in Non-Patent Documents 1 and 2, in transferring the carrier existing in the quantum structure to the adjacent quantum structure by tunneling conduction, if there is a large energy difference between the quantum levels of the adjacent quantum structures, a tunneling probability of the carrier is decreased. Therefore, in order to increase the tunneling probability, it is preferable to reduce the energy difference between the quantum levels of the adjacent quantum structures. On the other hand, when the p-i-n-type solar cell employing the quantum structure is used at room temperature, the thermal excitation energy is less than 30 meV. Therefore, in order to transfer the carrier in the quantum structure to the n-layer and the p-layer by thermal excitation, it is preferable to reduce an energy barrier between the quantum structure, and the n-layer or the p-layer.

In Patent Document 1, the quantum dot is employed; if the carrier existing in the quantum dot can be transferred by tunneling conduction, it is considered possible to provide an optical semiconductor device having high efficiency. However, the technique disclosed in Patent Document 1 fails to attempt to reduce the energy difference between the quantum levels of the adjacent quantum dots. Thus, it is difficult to takeout the carrier existing in a ground quantum level and the like, causing difficulty in improving the photoelectric conversion efficiency. This problem is difficult to solve even by a combination of the techniques disclosed in Patent Documents 1 and 2.

Accordingly, an object of the present invention is to provide a photoelectric conversion device capable of improving photoelectric conversion efficiency.

Solution to Problems

In order to solve the problems described above, the present invention takes the following means. That is, the present invention is a photoelectric conversion device comprising: a p-layer; an n-layer; an i-layer disposed between the p-layer and the n-layer; a first electrode connected to the p-layer; and a second electrode connected to the n-layer, wherein the i-layer comprises: a wall layer constituted by a first semiconductor; and a quantum structure portion constituted by a second semiconductor and disposed in the wall layer; a band gap of the first semiconductor is wider than that of the second semiconductor; a p-type impurity is contained in a region on the n-layer side of the i-layer, and/or an n-type impurity is contained in a region on the p-layer side of the i-layer; in a case of containing the p-type impurity in the region on the n-layer side of the i-layer, when a concentration of the p-type impurity that may be contained in the middle of the i-layer in a thickness direction thereof is defined as $Cp1$, and a concentration of the p-type impurity contained in the region on the n-layer side of the i-layer is defined as $Cp2$, the relation $Cp1<Cp2$ is satisfied; and in a case of containing the n-type impurity in the region on the p-layer side of the i-layer, when a concentration of the n-type impurity that may be contained in the middle of the i-layer in a thickness direction thereof is defined as $Cn1$, and a concentration of the n-type impurity contained in the region on the p-layer side of the i-layer is defined as $Cn2$, the relation $Cn1<Cn2$ is satisfied.

Here, in the present invention, the term "quantum structure portion" includes a quantum dot, quantum well, and quantum wire. Further, the "quantum structure portion constituted by a second semiconductor and disposed in the wall layer" denotes for example, that when the quantum structure portion is a quantum well or a quantum dot formed by a self-ordering process employing the Molecular Beam Epitaxy (MBE) method, and a wet layer, the wall layer and the quantum structure portion are alternately laminated. On the other hand, when the quantum structure portion is a colloidal quantum dot or a quantum wire, it denotes that the quantum structure portion is embedded in the wall layer. Furthermore, in the present invention, the "thickness direction of the i-layer" refers to a laminating direction of the p-layer, i-layer, and n-layer. The "middle of the i-layer in a thickness direction thereof" refers to a portion in the i-layer, in which a distance from the portion to an end face on the p-layer side of the i-layer is equal to a distance from the portion to an end face on the n-layer side of the i-layer. The "n-type impurity" refers to a substance which is doped into the i-layer to generate an electron in the i-layer. And the "region on the p-layer side of the i-layer" refers to the i-layer positioned on the p-layer side, when bisecting the i-layer disposed between the p-layer and the n-layer by a plane in a direction orthogonal to a laminating direction of the p-layer, n-layer, and i-layer. In the present invention, the middle of the i-layer in the thickness direction thereof does not include the region on the p-layer side of the i-layer. Additionally, in the present invention, the "p-type impurity" refers to a substance which is doped into the i-layer to generate a hole in the i-layer. And the "region on the n-layer side of the i-layer" refers to the i-layer positioned on the n-layer side when bisecting the i-layer disposed between the p-layer and the n-layer by a plane in a direction orthogonal to a laminating direction of the p-layer, n-layer, and i-layer. In the present invention, the middle of the i-layer in the thickness direction thereof does not include the region on the n-layer side of the i-layer. Moreover, in the present invention, the "photoelectric conversion device" includes concepts of a photodetecting device, solar cell, and the like.

In the present invention described above, the p-type impurity is preferably contained in an end portion on the n-layer side of the i-layer.

Here, in the present invention, the "end portion on the n-layer side of the i-layer" refers to: a region of which thickness measured from the n-layer to the inside of the i-layer is a length of one side of a square including one quantum structure portion on average, in a case when the quantum structure portions are randomly disposed; and a region of which thickness measured from the n-layer to the inside of the i-layer is the same as one period of the quantum structure portions, in a case when the quantum structure portions are periodically disposed.

In the present invention, in which the p-type impurity is contained in the end portion on the n-layer side of the i-layer, the $Cp2$ and the concentration of the n-type impurity in the n-layer are preferably controlled so that the electron can be transferred to the n-layer from the quantum structure portion contained in the end portion on the n-layer side of the i-layer by tunneling conduction.

Further, in the present invention, in which $Cp2$ and the concentration of the n-type impurity in the n-layer are controlled, the energy level at the lower end of the conduction band of the end face on the second electrode side of the n-layer is preferably at or below the ground level of the quantum structure portion contained in the end portion on the n-layer side of the i-layer.

Herein, that "the energy level at the lower end of the conduction band of the end face on the second electrode side of the n-layer is at or below the ground level of the quantum structure portion contained in the end portion on the n-layer side of the i-layer" means that when a band diagram is made in which the energy of an electron is higher on an upper side and the energy of a hole is higher on a lower side, the energy level at the lower end of the conduction band of the end face on the second electrode side of the n-layer is the same as the ground level of the quantum structure portion contained in the end portion on the n-layer side of the i-layer, or is positioned below the ground level of the quantum structure portion contained in the end portion on the n-layer side of the i-layer. Further, the "the ground level of the quantum structure portion contained in the end portion on the n-layer side of the i-layer" refers to the ground level (of the quantum structure portion contained in the end portion of the i-layer on the side of the n-layer) which an electron can enter.

Additionally, in the present invention, when the p-type impurity is contained in the region on the n-layer side of the i-layer, a triangular potential having the quantum level is preferably formed in the conduction band of the n-layer by disposing an $n^+$-layer between the n-layer and the second electrode, in such a manner that the energy level at the lower end of the conduction band of the end face on the n-layer side of the $n^+$-layer is higher than the energy level at the lower end of the conduction band of the end face on the $n^+$-layer side of the n-layer.

Herein, that "the energy level at the lower end of the conduction band of the end face on the n-layer side of the $n^+$-layer is higher than the energy level at the lower end of the conduction band of the end face on the $n^+$-layer side of the n-layer" means that when a band diagram is made in which the energy of an electron is higher on the upper side and the energy of a hole is higher on the lower side, the energy level at the lower end of the conduction band of the end face on the n-layer side of the $n^+$-layer is positioned above the energy level at the lower end of the conduction band of the end face on the $n^+$-layer side of the n-layer.

Further, in the present invention, in which the triangular potential having the quantum level is formed in the conduction band of the n-layer by disposing the $n^+$-layer, the quantum level formed in the conduction band of the n-layer is preferably approximately equal to the energy level at the lower end of the conduction band of the end face on the second electrode side of the $n^+$-layer.

Herein, that "the quantum level formed in the conduction band of the n-layer is approximately equal to the energy level at the lower end of the conduction band of the end face on the second electrode side of $n^+$-layer" means that when there is one quantum level formed in the conduction band of the n-layer, this one quantum level is approximately equal to the energy level at the lower end of the conduction band of the end face on the second electrode side of the $n^+$-layer. On the other hand, when there are two or more quantum levels formed in the conduction band of the n-layer, one of the two or more quantum levels is approximately equal to the energy level at the lower end of the conduction band of the end face on the second electrode side of the $n^+$-layer. Further, the phrase "approximately equal" includes the idea of being equal, and of being within a range of thermal fluctuation, that is, within a range of KbT, ('Kb' referring to the Boltzmann constant; and 'T' referring to the temperature, e.g. around a room temperature of 300 K).

In the present invention described above, the n-type impurity is preferably contained in an end portion on the p-layer side of the i-layer.

Here, in the present invention, the "end portion on the p-layer side of the i-layer" refers to: a region of which thickness measured from the p-layer to the inside of the i-layer is a length of one side of a square including one quantum structure portion on average, in a case when the quantum structure portions are randomly disposed; and a region of which thickness measured from the p-layer to the inside of the i-layer is the same as one period of the quantum structure portions, in a case when the quantum structure portions are periodically disposed.

Further, in the present invention, in which the n-type impurity is contained in the end portion on the p-layer side of the i-layer, Cn2 and the concentration of the p-type impurity in the p-layer are preferably controlled so that the hole can be transferred to the p-layer from the quantum structure portion contained in the end portion on the p-layer side of the i-layer by tunneling conduction.

In addition, in the present invention, in which the Cn2 and the concentration of the p-type impurity in the p-layer are controlled, the energy level at the upper end of the valence band of the end face on the first electrode side of the p-layer is preferably at or above the ground level of the quantum structure portion contained in the end portion on the p-layer side of the i-layer.

Herein, that "the energy level at the upper end of the valence band of the end face on the first electrode side of the p-layer is preferably at or above the ground level of the quantum structure portion contained in the end portion on the p-layer side of the i-layer" means that when a band diagram is made in which the energy of an electron is higher on the upper side and the energy of a hole is higher on the lower side, the energy level at the upper end of the valence band of the end face on the first electrode side of the p-layer is the same as the ground level of the quantum structure portion contained in the end portion on the p-layer side of the i-layer, or is positioned above the ground level of the quantum structure portion contained in the end portion on the p-layer side of the i-layer. Further, the "ground level of the quantum structure portion contained in the end portion on the p-layer side of the i-layer" refers to the ground level (of the quantum structure portion contained in the end portion on the p-layer side of the i-layer) which a hole can enter.

Additionally, in the present invention, when the n-type impurity is contained in the region on the p-layer side of the i-layer, a triangular potential having the quantum level is preferably formed in the valence band of the p-layer by disposing a $p^+$-layer between the p-layer and the first electrode, in such a manner that the energy level at the upper end of the valence band of the end face on the p-layer side of the $p^+$-layer is lower than the energy level at the upper end of the valence band of the end face on the $p^+$-layer side of the p-layer, Herein, that "the energy level at the upper end of the valence band of the end face on the p-layer side of the $p^+$-layer is lower than the energy level at the upper end of the valence band of the end face on the $p^+$-layer side of the p-layer" means that when a band diagram is made in which the energy of an electron is higher on the upper side and the energy of a hole is higher on the lower side, the energy level at the upper end of the valence band of the end face on the p-layer side of the $p^+$-layer is positioned below the energy level at the upper end of the valence band of the end face on the $p^+$-layer side of the p-layer.

Further, in the present invention in which the triangular potential having the quantum level is formed in the valence band of the p-layer by disposing the $p^+$-layer, the quantum level formed in the valence band of the p-layer is preferably approximately equal to the energy level at the upper end of the valence band of the end face on the first electrode side of $p^+$-layer.

Herein, that "the quantum level formed in the valence band of the p-layer is approximately equal to the energy level at the upper end of the valence band of the end face on the first electrode side of the $p^+$-layer" means that when there is one quantum level formed in the valence band of the p-layer, this one quantum level is approximately equal to the energy level at the upper end of the valence band of the end face on the first electrode side of the $p^+$-layer. On the other hand, when there are two or more quantum levels formed in the valence band of the p-layer, one of the two or more quantum levels is approximately equal to the energy level at the upper end of the valence band of the end face on the first electrode side of the $p^+$-layer. Further, the phrase "approximately equal" includes the idea of being equal, and of being within a range of thermal fluctuation, that is, within a range of KbT, ('Kb' referring to the Boltzmann constant; and 'T' referring to the temperature, e.g. around a room temperature of 300 K).

Effects of the Invention

According to the present invention, since the relations Cp1<Cp2 and/or Cn1<Cn2 are satisfied, it is possible to make the band of the i-layer gently-inclined. By making the band of the i-layer gently-inclined, the energy difference between the quantum levels of the adjacent quantum structure portions can be reduced. Therefore, with the present invention, the carrier in the quantum structure portion can be easily transferred by tunneling conduction. By enabling the carrier to be easily transferred, it becomes possible to improve the photoelectric conversion efficiency. Therefore, according to the present invention, it is possible to provide a photoelectric conversion device which is capable of improving the photoelectric conversion efficiency.

Further, in the present invention, by containing the p-type impurity in the end portion on the n-layer side of the i-layer, it is possible to make gentle the band inclination in the end portion on the n-layer side of the i-layer, where increase in the energy difference between the quantum levels of the adjacent quantum structure portions tends to occur. As a result, it becomes possible to reduce the energy difference between the quantum levels of the quantum structure portion existing in the end portion on the n-layer side of the i-layer, and the quantum level of the quantum structure portion adjacent to the above quantum structure portion; and therefore, a number of electrons can be transferred to the quantum structure portion existing in the end portion on the n-layer side of the i-layer, by tunneling conduction.

In the present invention, by controlling Cp1 and the concentration of the n-type impurity in the n-layer so that the electron can be transferred to the n-layer from the quantum structure portion contained in the end portion on the n-layer side of the i-layer by tunneling conduction, the electrons existing in the ground quantum level of the quantum structure portion can be easily transferred to the n-layer.

Also, in the present invention, by setting the energy level at the lower end of the conduction band of the end face on the second electrode side of the n-layer at or below the ground level of the quantum structure portion contained in the end portion on the n-layer side of the i-layer, the electron existing in the quantum structure portion can be easily transferred to the n-layer by tunneling conduction.

In the present invention, by forming the triangular potential having the quantum level in the conduction band of the n-layer, it becomes possible to transfer the electron to the n-layer through the quantum level of the triangular potential, thereby enabling easily improving the photoelectric conversion efficiency.

In the present invention, by making the quantum level formed in the conduction band of the n-layer approximately equal to the energy level at the lower end of the conduction band of the end face on the second electrode side of the $n^+$-layer, the photoelectric conversion efficiency can be easily improved.

Additionally, in the present invention, by containing the n-type impurity in the end portion on the p-layer side of the i-layer, it becomes possible to make gentle the band inclination in the end portion on the p-layer side of the i-layer, where increase in the energy difference between the quantum levels of the adjacent quantum structure portions tends to occur. As a result, it becomes possible to reduce the energy difference between the quantum levels of the quantum structure portion existing in the end portion on the p-layer side of the i-layer, and the quantum level of the quantum structure portion adjacent to the above quantum structure portion; and therefore, a number of holes can be easily transferred to the quantum structure portion existing in the end portion on the p-layer side of the i-layer by tunneling conduction.

In the present invention, by controlling Cn2 and the concentration of the p-type impurity in the p-layer so that the hole can be easily transferred to the p-layer from the quantum structure portion contained in the end portion on the p-layer side of the i-layer by tunneling conduction, the holes existing in the ground quantum level of the quantum structure portion can be easily transferred to the p-layer.

Also, in the present invention, by setting the energy level at the upper end of the valence band of the end face on the first electrode side of the p-layer at or above the ground level of the quantum structure portion contained in the end portion on the p-layer side of the i-layer, the hole existing in the quantum structure portion can be easily transferred to the p-layer by tunneling conduction.

In the present invention, by forming the triangular potential having the quantum level in the valence band of the p-layer, it becomes possible to transfer the hole to the p-layer through the quantum level of the triangular potential, thereby enabling easily improving the photoelectric conversion efficiency.

In the present invention, by making the quantum level formed in the valence band of the p-layer approximately equal to the energy level at the upper end of the valence band of the end face on the first electrode side of the $p^+$-layer, the photoelectric conversion efficiency can be easily improved.

Figure 1:
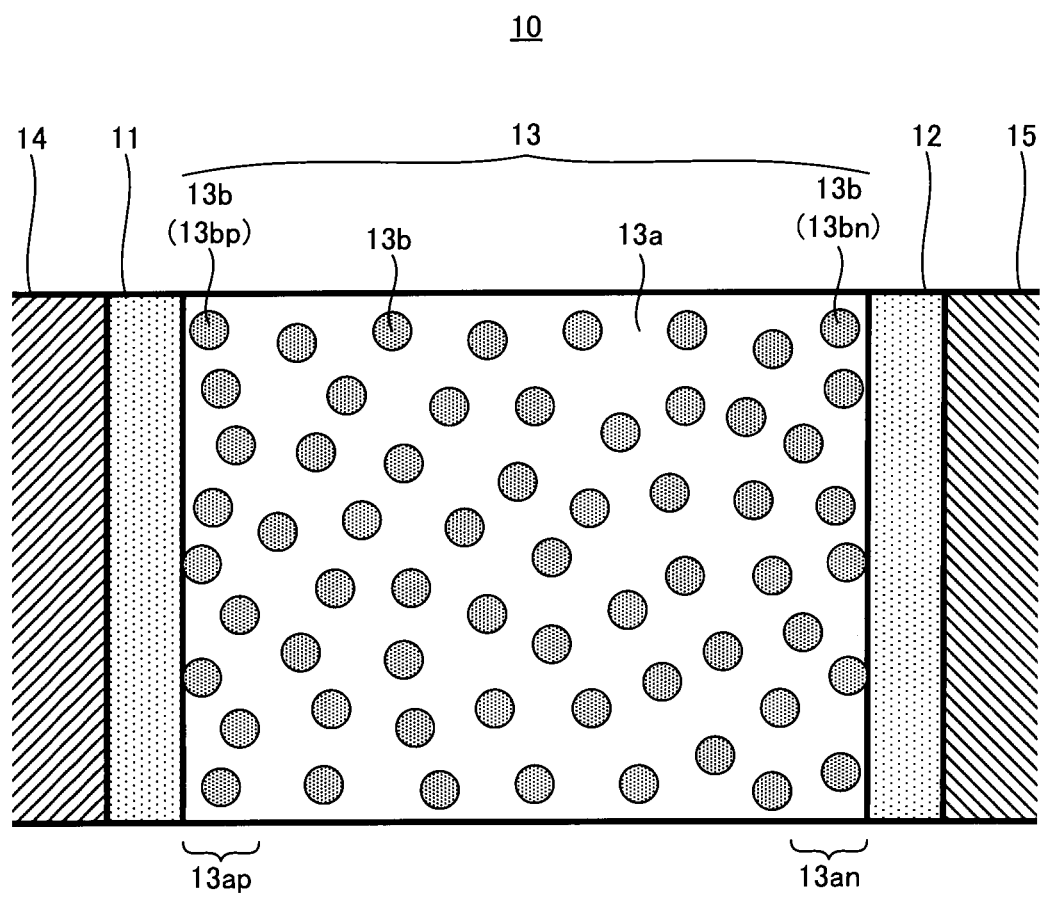
FIG. 1 is a cross-sectional view illustrating an embodiment of a solar cell 10.

LIST OF REFERENCE NUMERALS 10 solar cell
11 p-layer
12 n-layer
13 i-layer
13*a* wall layer
13*an* wall layer
13*ap* wall layer
13*b* quantum dot
13*bn* quantum dot
13*bp* quantum dot
14 first electrode
15 second electrode
20 solar cell
21 p-layer
22 n-layer
23 i-layer
23*a* wall layer
23*an* wall layer
23*ap* wall layer
23*b* quantum dot
23*bn* quantum dot
23*bp* quantum dot
30 solar cell
31 i-layer
31*a* wall layer
31*an* wall layer
31*ap* wall layer
31*b* barrier
31*c* wet layer
31*d* quantum dot
31*e* layer
31*en* layer
31*ep* layer
40 solar cell
41 p-layer
42 n-layer
43 $p^+$-layer
44 $n^+$-layer
50 solar cell
51 $p^+$-layer
52 $n^+$-layer
60 solar cell
61 insulating layer
62 insulating layer
70 solar cell

MODES FOR CARRYING OUT THE INVENTION

Hereinafter, a case in which the present invention is applied to a solar cell will be described with reference to the drawings. It should be noted that the embodiments shown below are examples of the present invention, to which the invention is not limited.

1. A First Embodiment

FIG. 1 is a cross-sectional view illustrating a solar cell 10 in accordance with a first embodiment. Some of the reference numerals are omitted in FIG. 1. As shown in FIG. 1, the solar cell 10 comprises: a p-layer 11; an n-layer 12; an i-layer 13 disposed between the p-layer 11 and the n-layer 12; a first electrode 14 connected to the p-layer 11; and a second electrode connected to the n-layer 12. The i-layer 13 comprises a wall layer 13a and quantum dots 13b, 13b, . . . , (sometimes simply referred to as a "quantum dot 13b", hereinafter) disposed in the wall layer 13a. The wall layer 13a is constituted by a first semiconductor; and the quantum dots 13b, 13b, . . . are constituted by a second semiconductor having a band gap narrower than that of the first semiconductor. In the solar cell 10, a spacing among the quantum dots 13b, 13b, . . . is configured to permit a carrier to be transferred by tunneling conduction. An n-type impurity is contained in the wall layer 13a, in the end portion on the p-layer 11 side of the i-layer 13, (hereinafter referred to as a "wall layer 13ap"); and a p-type impurity is contained in the wall layer 13a, in the end portion on the n-layer 12 side of the i-layer 13, (hereinafter referred to as a "wall layer 13an"). In contrast, the n-type impurity and the p-type impurity are not contained in the region of the wall layer 13a other than the wall layer 13ap and the wall layer 13an. That is, when a concentration of the n-type impurity in the middle of the i-layer 13 in a thickness direction thereof is defined as $Cn11$, a concentration of the n-type impurity contained in a region on the p-layer 11 side of the i-layer 13 is defined as $Cn12$, a concentration of the p-type impurity in the middle of the i-layer 13 in the thickness direction thereof is defined as $Cp11$, and a concentration of the p-type impurity contained in a region on the n-layer 12 side of the i-layer 13 is defined as $Cp12$, the relations $Cn11<Cn12$ and $Cp11<Cp12$ are satisfied in the solar cell 10.

Figure 2:
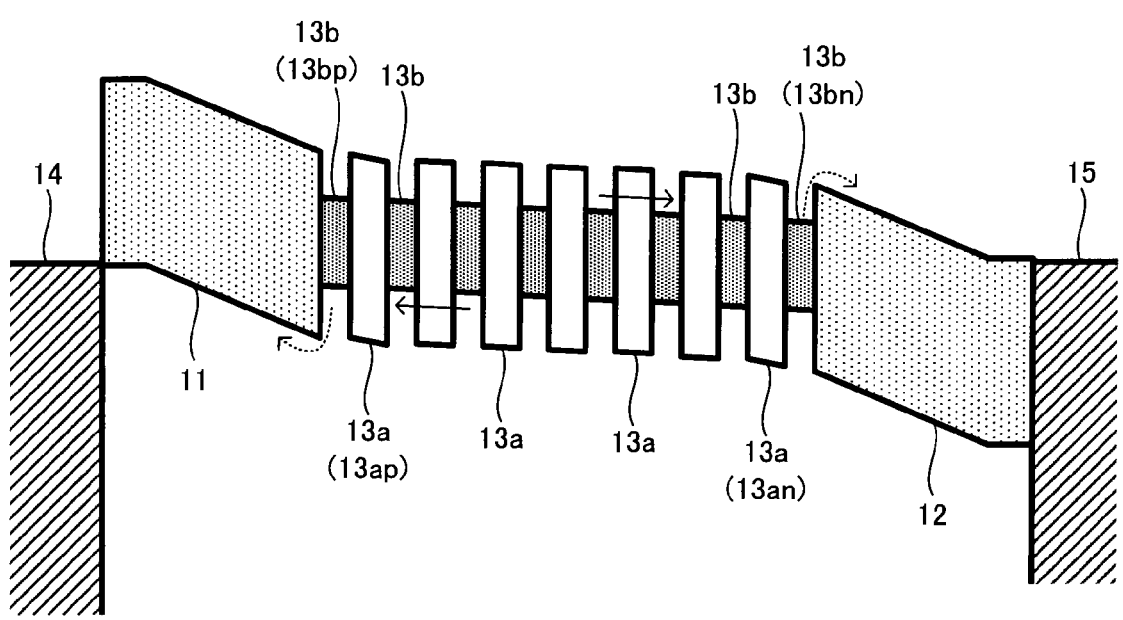
FIG. 2 is a band diagram showing the solar cell 10.

FIG. 2 is a band diagram of the solar cell 10. The energy of an electron is higher on the upper side of the sheet of FIG. 2, and the energy of a hole is higher on the lower side of the sheet. In FIG. 2, the reference numerals corresponding to each element of the solar cell 10 are given, and some of the numerals are omitted. In FIG. 2, the arrow from the left side of the sheet to the right side shows a traveling pattern of an electron; and the arrow from the right side of the sheet to the left side shows a traveling pattern of a hole. Hereinafter, the explanations of the solar cell 10 will be continued with reference to FIGS. 1 and 2.

As shown in FIG. 2, in the solar cell 10, an internal electric field is generated by the p-layer 11 and the n-layer 12, and the band is inclined. And the band inclination of the i-layer 13, in other words, the band inclination of the wall layer 13a and the band inclination of the quantum dot 13b are made gentle by the n-type impurity contained in the wall layer 13ap and by the p-type impurity contained in the wall layer 13an. Further, as shown in FIG. 2, the energy level at the lower end of the conduction band of the end face on the second electrode 15 side of the n-layer 12 is positioned below the ground level (i.e. a ground level at which an electron can exist; hereinafter referred to as a "ground level of a quantum dot 13bn") of the quantum dots 13b, 13b, . . . disposed in the end portion on the n-layer 12 side of the i-layer 13, (hereinafter the quantum dots being referred to as a "quantum dot 13bn"). The energy level at the upper end of the valence band of the end face on the first electrode 14 side of the p-layer 11 is positioned above the ground level (i.e. a ground level at which a hole can exist; hereinafter referred to as a "ground level of a quantum dot 13bp") of the quantum dots 13b, 13b, . . . disposed in the end portion on the p-layer 11 side of the i-layer 13, (hereinafter referred to as a "quantum dot 13bp").

In the solar cell 10, when the light is made incident upon the i-layer 13, an electron-hole pair is generated in both the wall layer 13a and the quantum dot 13b. At least a part of the carriers generated in the wall layer 13a drift in the wall layer 13a, the hole reaching the wall layer 13ap, and the electron reaching the wall layer 13an. And at least a part of the holes having reached the wall layer 13ap directly reach the p-layer 11, whereas at least a part of the remaining holes having reached the wall layer 13ap fall into the quantum dot 13bp. Further, at least a part of the electrons having reached the wall layer 13an directly reach the n-layer 12, whereas at least a part of the remaining electrons having reached the wall layer 13an fall into the quantum dot 13bn. On the other hand, as described above, the second semiconductor constituting the quantum dot 13b has a band gap narrower than that of the first semiconductor constituting the wall layer 13a; therefore, at least a part of the carriers generated in the wall layer 13a fall into the quantum dot 13b. Here, in the solar cell 10, the energy difference between the quantum levels of the adjacent quantum dots 13b, 13b is reduced by containing the n-type impurity in the wall layer 13ap and containing the p-type impurity in the wall layer 13an. Hence, the carriers which have fallen into the quantum dot 13b can easily move among the quantum dots 13b, 13b, . . . by tunneling conduction, the hole reaching the quantum dot 13bp, and the electron reaching the quantum dot 13bn. On the other hand, the carriers generated in the quantum dot 13b likewise move among the quantum dots 13b, 13b, . . . by tunneling conduction, the hole reaching the quantum dot 13bp, and the electron reaching the quantum dot 13bn. As shown in FIG. 2, in the solar cell 10, the energy level at the upper end of the valence band of the end face on the quantum dot 13bp side of the p-layer 11 is positioned below the ground level of the quantum dot 13bp; on the other hand, the energy level at the upper end of the valence band of the end face on the first electrode 14 side of the p-layer 11 is positioned above the ground level of the quantum dot 13bp. Therefore, the hole having reached the quantum dot 13bp can move to the p-layer 11 by being thermally excited. In addition, as shown in FIG. 2, in the solar cell 10, the energy level at the lower end of the conduction band of the end face on the quantum dot 13bn side of the n-layer 12 is positioned above the ground level of the quantum dot 13bn; on the other hand, the energy level at the lower end of the conduction band of the end face on the second electrode 15 side of the n-layer 12 is positioned below the ground level of the quantum dot 13bn. Therefore, the electron having reached the quantum dot 13bn can move to the n-layer 12 by being thermally excited.

Herein, the quantum dot 13b (including the quantum dot 13bp and the quantum dot 13bn; hereinafter the same shall apply.) has a discrete quantum level; and the number of the carriers that each of the quantum dots 13b, 13b, . . . can incorporate is limited. Further, it is assumed that the hole is incorporated into the quantum dot 13bp from the deep level (i.e. the quantum level at which the energy is relatively low), and that the electron is also incorporated into the quantum dot 13bn from the deep level (i.e. the quantum level at which the energy is relatively low). Therefore, the hole which is incorporated into the quantum dot 13bp after the hole that has already been incorporated, enters the shallow level (i.e. the quantum level at which the energy is relatively high) of the quantum dot 13bp; and the electron which is incorporated into the quantum dot 13bn after the electron that has already been incorporated, enters the shallow level (i.e. the quantum level at which the energy is relatively high) of the quantum dot 13bn. The energy barrier is low for the hole having entered the shallow level of the quantum dot 13bp to overcome in order to move to the p-layer 11. Thus, the hole can easily move from the quantum dot 13bp to the p-layer 11 by being thermally excited. Likewise, the energy barrier is low for the electron having entered the shallow level of the quantum dot 13bn to overcome in order to move to the n-layer 12. Thus, the electron can easily move from the quantum dot 13bn to the n-layer 12 by being thermally excited.

In this way, according to the solar cell 10, by reducing the energy difference between the quantum levels of the adjacent quantum dots 13b, 13b, the hole existing in the quantum dot 13b can be easily transferred to the quantum dot 13bp by tunneling conduction, and the electron existing in the quantum dot 13b can be easily transferred to the quantum dot 13bn. The hole existing in the quantum dot 13bp can be easily transferred to the p-layer 11, and the electron existing in the quantum dot 13bn can be easily transferred to the n-layer 12; therefore, in the solar cell 10, it is possible to easily take out the carrier from the quantum dot 13b. By enabling the carrier to be easily taken out from the quantum dot, the photoelectric conversion efficiency can be improved. Therefore, according to the present invention, it is possible to provide the solar cell 10 which is capable of improving the photoelectric conversion efficiency.

As described above, the quantum dot 13b has a discrete quantum level; and the quantum level of the quantum dot especially on the low energy side is more discrete than that of the other quantum structures (such as a quantum well and quantum wire). Further, it is assumed that the time required for the carrier to relax its energy among the discrete quantum levels is longer than the time required for the carrier to relax its energy among the continuous quantum levels. Thus, with the solar cell 10 comprising the quantum 13b, it is possible to elongate the time period in which the electron and the hole are recombined; as a result, the photoelectric conversion efficiency can be easily improved.

In the solar cell 10, the wall layer 13a can be constituted by ZnO or the like. Further, the p-layer 11 can be constituted by a material obtained by doping a known p-type impurity into a semiconductor material to constitute the wall layer 13a, or can be constituted by p-type $Cu_2O$ or the like. The n-layer 12 can be constituted by a material obtained by doping a known n-type impurity into a semiconductor material to constitute the wall layer 13a. Furthermore, the wall layer 13ap can be constituted by a material obtained by doping into a material to constitute the wall layer 13a, a small amount of n-type impurity (i.e. the amount of the n-type impurity which allows an electron concentration of the wall layer 13ap to be lower than that of the n-layer 12; hereinafter the same shall apply). The wall layer 13an can be constituted by a material obtained by doping into a material to constitute the wall layer 13a, a small amount of p-type impurity (i.e. the amount of the p-type impurity which allows a hole concentration of the wall layer 13an to be lower than that of the p-layer 11, hereinafter the same shall apply). In addition, as a constituent material of the quantum dot 13b, a material having a band gap narrower than that of the material constituting the wall layer 13a can be adequately used. And, as a constituent material of the electrodes 14 and 15, a known material which is usable as an electrode of a solar cell can be adequately used.

In the solar cell 10 having such configurations, the middle portion of the i-layer 13 in the thickness direction thereof can be produced, for example, by the steps of: dissolving the first semiconductor constituting the wall layer 13a in a solution by using an organic solvent or the like; dispersing a commercially available quantum dot in the solution; and then volatilizing the solvent to sinter.

Also, the end portion on the p-layer 11 side of the i-layer 13 can be produced, for example, by the steps of: dissolving a precursor of a semiconductor obtained by doping a small amount of n-type element into the first semiconductor (i.e. a semiconductor to constitute the wall layer 13ap) in a solution by using an organic solvent; dispersing a commercially available quantum dot in the solution; and then volatilizing the solvent to sinter.

Further, the end portion on the n-layer 12 side of the i-layer 13 can be produced, for example, by the steps of: dissolving a precursor of a semiconductor obtained by doping a small amount of p-type element into the first semiconductor (i.e. a semiconductor to constitute the wall layer 13an) in a solution by using an organic solvent; dispersing a commercially available quantum dot in the solution; and then volatilizing the solvent to sinter.

In producing the solar cell 10, for example, the following is carried out: the p-layer 11 is formed on a surface of a known glass substrate by a known method such as vapor desposition; the i-layer 13 is formed, by the above method, on a surface of the formed p-layer 11; and then the n-layer 12 is formed, by the known method such as vapor desposition, on a surface of the formed i-layer 13. After the p-layer 11, i-layer 13, and n-layer 13 are formed in the mentioned order in this manner, a part of the n-layer 12 and the i-layer 13 is etched to secure conduction with the p-layer 11. And then, the first electrode 14 is formed on the surface of the p-layer 11, and the second electrode 15 is formed on the surface of the n-layer 12, respectively by the known method such as an electron-beam deposition method. The solar cell 10 can be produced by carrying out these steps.

2. A Second Embodiment

Figure 3:
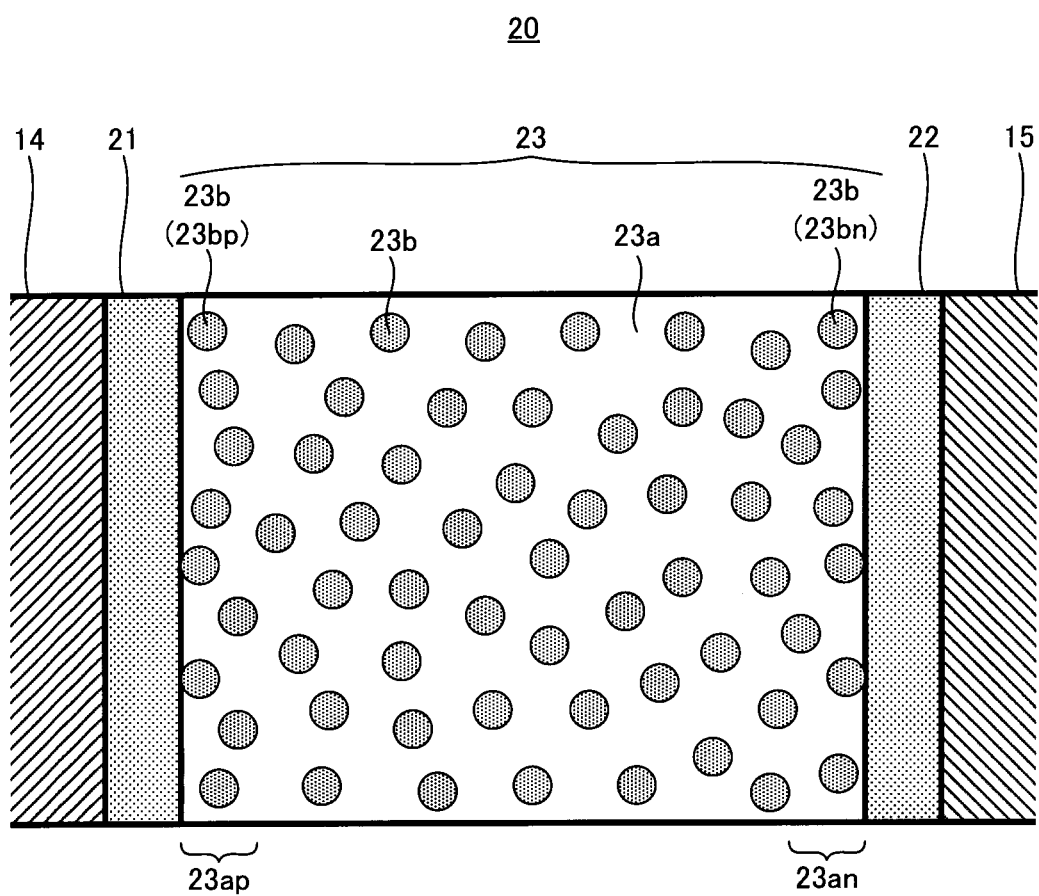
FIG. 3 is a cross-sectional view illustrating an embodiment of a solar cell 20.

FIG. 3 is a cross-sectional view illustrating a solar cell 20 in accordance with a second embodiment. Some of the reference numerals are omitted in FIG. 3. In FIG. 3, to the elements having the same structure as those in the solar cell 10, the same reference numerals as those used in FIGS. 1 and 2 are given, and the explanations thereof are adequately omitted.

As shown in FIG. 3, the solar cell 20 comprises: a p-layer 21; an n-layer 22; an i-layer 23 disposed between the p-layer 21 and the n-layer 22; a first electrode 14 connected to the p-layer 21; and a second electrode 15 connected to the n-layer 22. A concentration of a hole contained in the p-layer 21 is higher than that of the hole contained in the p-layer 11 of the solar cell 10; and a concentration of an electron contained in the n-layer 22 is higher than that of the electron contained in the n-layer 12 of the solar cell 10. The i-layer 23 comprises a wall layer 23a and quantum dots 23b, 23b, . . . , (sometimes simply referred to as a "quantum dot 23b", hereinafter) disposed in the wall layer 23a. The wall layer 23a is constituted by a first semiconductor; and the quantum dot 23b is constituted by a second semiconductor having a band gap narrower than that of the first semiconductor. In the solar cell 20, a spacing among the quantum dots 23b, 23b, . . . is configured to permit a carrier to be transferred by tunneling conduction. An n-type impurity is contained in the wall layer 23a, in the end portion on the p-layer 11 side of the i-layer 23, (hereinafter referred to as a "wall layer 23ap"); and an electron concentration of the wall layer 23*ap* is higher than that of the wall layer 13*ap* of the solar cell 10. Further, a p-type impurity is contained in the wall layer 23*a*, in the end portion on the n-layer 22 side of the i-layer 23, (hereinafter referred to as a "wall layer 23*an*"); and a hole concentration of the wall layer 23*an* is higher than that of the wall layer 13*an* of the solar cell 10. In contrast, the n-type impurity and the p-type impurity are not contained in the region of the wall layer 23*a* other than the wall layer 23*ap* and the wall layer 23*an*. That is, when, a concentration of the n-type impurity in the middle of the i-layer 23 in a thickness direction thereof is defined as Cn21, a concentration of the n-type impurity contained in the region on the p-layer 21 side of the i-layer 23 is defined as Cn22, a concentration of the p-type impurity in the middle of the i-layer 23 in the thickness direction thereof is defined as Cp21, and a concentration of the p-type impurity contained in the region on the n-layer 22 side of the i-layer 23 is defined as Cp22, the relations Cn21<Cn22 and Cp21<Cp22 are satisfied in the solar cell 20.

Figure 4:
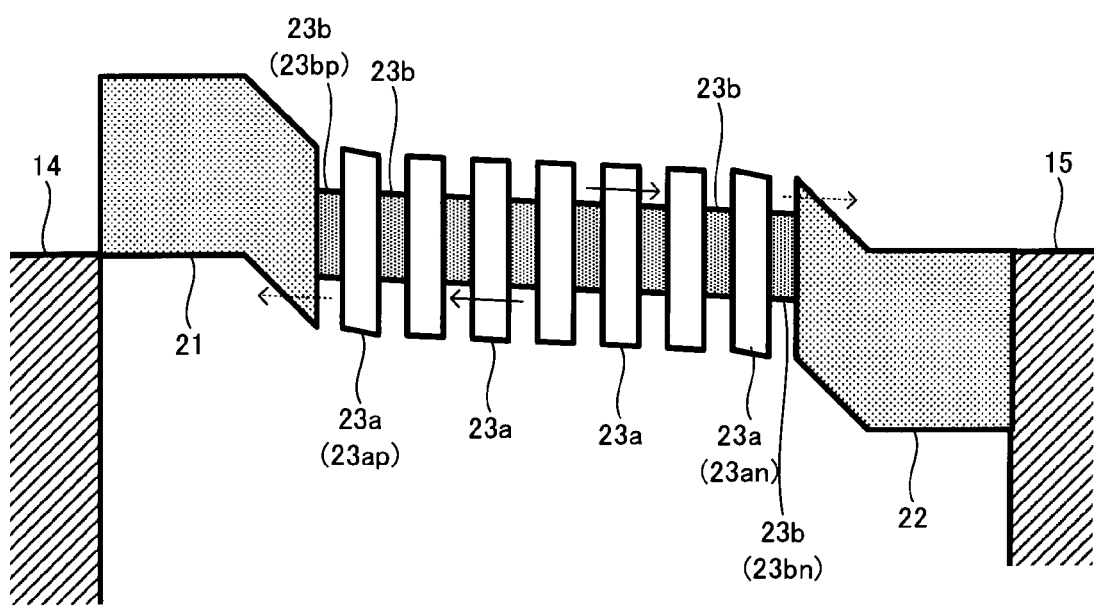
FIG. 4 is a band diagram showing the solar cell 20.

FIG. 4 is a band diagram of the solar cell 20. The energy of an electron is higher on the upper side of the sheet of FIG. 4, and the energy of a hole is higher on the lower side of the sheet. In FIG. 4, the reference numerals corresponding to each element of the solar cell 20 are given, and some of the numerals are omitted. In FIG. 4, the arrow from the left side of the sheet to the right side shows a traveling pattern of an electron; and the arrow from the right side of the sheet to the left side shows a traveling pattern of a hole. Hereinafter, the explanations of the solar cell 20 will be continued with reference to FIGS. 1 to 4.

As shown in FIG. 4, in the solar cell 20, an internal electric field is generated by the p-layer 21 and the n-layer 22, and the band is inclined. And the band inclination of the i-layer 23, in other words, the band inclination of the wall layer 23*a* and the band inclination of the quantum dot 23*b* are made gentle by the n-type impurity contained in the wall layer 23*ap* and by the p-type impurity contained in the wall layer 23*an*. In addition, as shown in FIG. 4, the energy level at the lower end of the conduction band of the end face on the second electrode 15 side of the n-layer 22 is positioned below the ground level (i.e. a ground level at which an electron can exist) of the quantum dots 23*b*, 23*b*, . . . disposed in the end portion on the n-layer 22 side of the i-layer 23, (hereinafter referred to as a "quantum dot 23*bn*"). The energy level at the upper end of the valence band of the end face on the first electrode 14 side of the p-layer 21 is positioned above the ground level (i.e. a ground level at which a hole can exist) of the quantum dots 23*b*, 23*b*, . . . disposed in the end portion on the p-layer 21 side of the i-layer 23 (, hereinafter referred to as a "quantum dot 23*bp*").

Furthermore, the solar cell 20 is provided with the p-layer 21 having a hole concentration higher than that of the p-layer 11 of the solar cell 10, and is provided with the wall layer 23*ap* having an electron concentration higher than that of the wall layer 13*ap* of the solar cell 10; so, the band inclination of the upper end of the valence band in the p-layer 21 is steeper than that of the upper end of the valence band in the p-layer 11 of the solar cell 10. With this configuration, it is possible to reduce the moving distance of the hole being transferred from the quantum dot 23*bp* to the p-layer 21 by tunneling conduction. Thus, according to the solar cell 20, the hole existing in the quantum dot 23*bp* can be easily transferred to the p-layer 21 by tunneling conduction. In this way, according to the solar cell 20, when the hole existing in the quantum dot 23*bp* is transferred to the p-layer 21, it can be easily transferred by tunneling conduction; therefore, the hole existing at the deep level (i.e. the quantum level at which the energy is relatively low) of the quantum dot 23*bp* can also be easily transferred to the first electrode 14.

On the other hand, the solar cell 20 is provided with the n-layer 22 having an electron concentration higher than that of the n-layer 12 of the solar cell 10, and is provided with the wall layer 23*an* having a hole concentration higher than that of the wall layer 13*an* of the solar cell 10; so, the band inclination of the lower end of the conduction band in the n-layer 22 is steeper than that of the lower end of the conduction band in the n-layer 12 of the solar cell 10. With this configuration, it is possible to reduce the moving distance of the electron being transferred from the quantum dot 23*bn* to the n-layer 22 by tunneling conduction. Thus, according to the solar cell 20, the electron existing in the quantum dot 23*bn* can be easily transferred to the n-layer 22 by tunneling conduction. In this way, according to the solar cell 20, when the electron existing in the quantum dot 23*bn* is transferred to the n-layer 22, it can be easily transferred by tunneling conduction; therefore, the electron existing at the deep level (i.e. the quantum level at which the energy is relatively low) of the quantum dot 23*bn* can also be easily transferred to the second electrode 15. Thus, according to the solar cell 20, it is possible to improve the photoelectric conversion efficiency better than in the case of the solar cell 10.

As described above, the quantum dot 23*b* has a discrete quantum level; and the quantum level of the quantum dot especially on the low energy side is more discrete than that of the other quantum structures (such as a quantum well and quantum wire). Further, it is assumed that the time required for the carrier to relax its energy among the discrete quantum levels is longer than the time required for the carrier to relax its energy among the continuous quantum levels. Thus, with the solar cell 20 comprising the quantum 23*b*, it is possible to elongate the time period in which the electron and the hole are recombined; as a result, the photoelectric conversion efficiency can be easily improved.

In the solar cell 20, the wall layer 23*a* can be constituted by the same material as that of the wall layer 13*a* of the solar cell 10. Further, the p-layer 21 can be constituted, for example, by a material obtained by doping into a semiconductor material to constitute the wall layer 23*a*, more amount of p-type impurity than in the case of the p-layer 11 of the solar cell 10. Also, the n-layer 22 can be constituted by a material obtained by doping into a semiconductor material to constitute the wall layer 23*a*, more amount of n-type impurity than in the case of the n-layer 12 of the solar cell 10. Furthermore, the wall layer 23*ap* can be constituted by a material obtained by doping into a material to constitute the wall layer 23*a*, more amount of n-type impurity than in the case of the wall layer 13*ap* of the solar cell 10. Also, the wall layer 23*an* can be constituted by a material obtained by doping into a material to constitute the wall layer 23*a*, more amount of p-type impurity than in the case of the wall layer 13*an* of the solar cell 10. In addition, the quantum dot 23*b* can be constituted by the same material as that of the quantum dot 13*b* of the solar cell 10. The solar cell 20 comprising each of the elements constituted by such materials as above, can be produced in a similar manner as in the case of the solar cell 10.

3. A Third Embodiment

Figure 5:
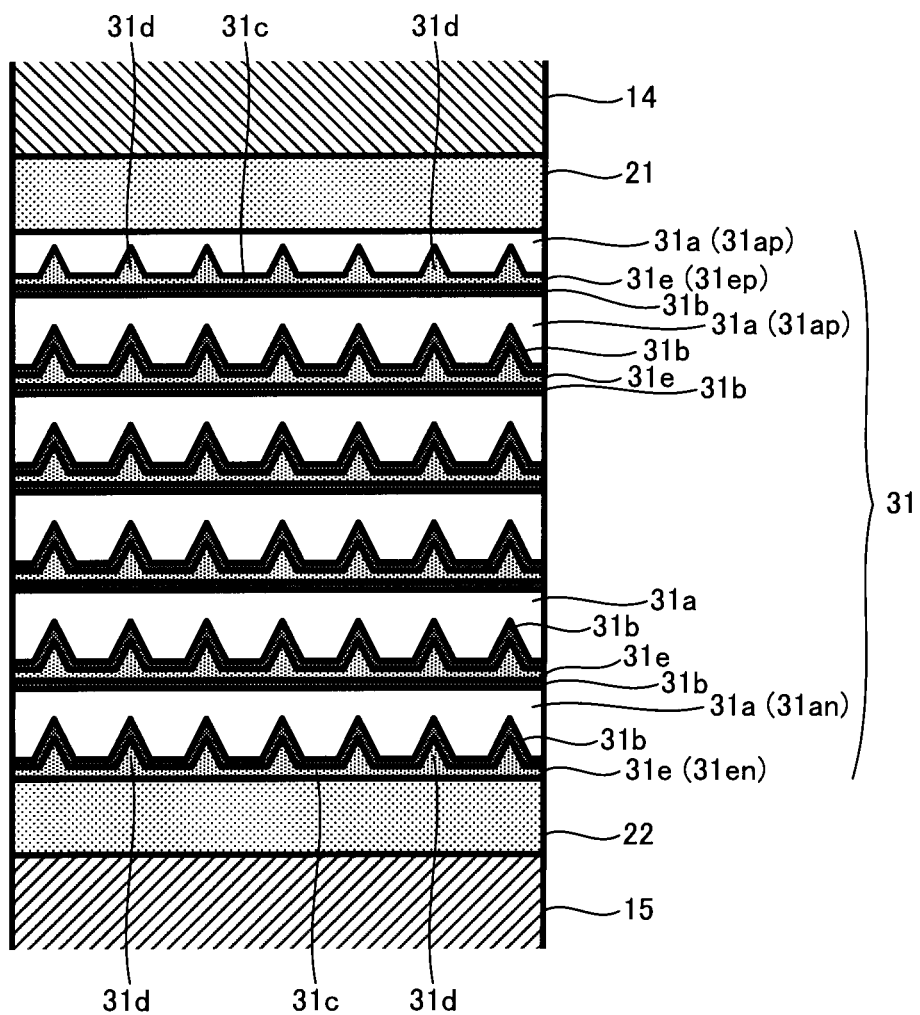
FIG. 5 is a cross-sectional view illustrating an embodiment of a solar cell 30.

FIG. 5 is a cross-sectional view illustrating a solar cell 30 in accordance with a third embodiment. Some of the reference numerals are omitted in FIG. 5. In FIG. 5, to the elements having the same structure as those in the solar cell 20, the same reference numerals as those used in FIGS. 3 and 4 are given, and the explanations thereof are adequately omitted.

As shown in FIG. 5, the solar cell 30 comprises: a p-layer 21; an n-layer 22; an i-layer 31 disposed between the p-layer 21 and the n-layer 22; a first electrode 14 connected to the p-layer 21; and a second electrode 15 connected to the n-layer 22. The i-layer 31 is configured in a manner laminating a wall layer 31a; a barrier 31b; and a layer 31e comprising a wet layer 31c and quantum dots 31d, 31d, ..., (sometimes simply referred to as a "quantum dot 31d", hereinafter). The wall layers 31a, 31a, ..., (sometimes simply referred to as a "wall layer 31a", hereinafter) are constituted by a first semiconductor; and the layers 31e, 31e, sometimes simply referred to as a "layer 31e", hereinafter) are constituted by a second semiconductor having a band gap narrower than that of the first semiconductor. In the solar cell 30, a spacing between the adjacent layers 31e, 31e (i.e. a total thickness of the wall layer 31a and the barriers 31b, 31b which are sandwiched by the two layers 31e, 31e; hereinafter the same shall apply.), is configured to permit a carrier to be transferred by tunneling conduction. And a spacing between adjacent the layers 31a, 31a (i.e. a total thickness of the layer 31e and the barriers 31b, 31b which are sandwiched by the two layers 31a, 31a; hereinafter the same shall apply), is configured to permit a carrier to be transferred by tunneling conduction.

In the solar cell 30, the quantum 31d is formed by a self-ordering process by employing the MBE method; and is formed in the wet layer 31c. Each of the barriers 31b, 31b, ..., (sometimes simply referred to as a "barrier 31b", hereinafter) is disposed between the layers 31e, 31e, ... and the wall layers 31a, 31a, ..., which are disposed in the middle of the i-layer 31 in the thickness direction thereof (i.e. a direction from the top to the bottom of the sheet of FIG. 5). And the barrier 31b is constituted by a material (a semiconductor or insulator) having a band gap wider than that of the first semiconductor. In contrast, the barrier 31b is not disposed on the p-layer 21 side of the layer 31e disposed in the end portion on the p-layer 21 side of the i-layer 31 (, sometimes simply referred to as a "layer 31ep", hereinafter), and is not disposed on the n-layer 22 side of the layer 31e disposed in the end portion on the n-layer 22 side of the i-layer 31 (, referred to as a "layer 31en"). Further, in the solar cell 30, an n-type impurity is contained in the wall layer 31a, in the end portion on the p-layer 21 side of the i-layer 31, (sometimes referred to as a "wall layer 31ap", hereinafter); and an electron concentration of the wall layer 31ap is high, (or highly-densed) like the electron concentration of the wall layer 23ap of the solar cell 20. Further, a p-type impurity is contained in the wall layer 31a, in the end portion on the n-layer 22 side of the i-layer 31, (sometimes referred to as a "wall layer 31an", hereinafter); and a hole concentration of the wall layer 23an is high, (or highly-densed) like the hole concentration of the wall layer 23an of the solar cell 20. In contrast, the n-type impurity and the p-type impurity are not contained in the region of the wall layer 31a other than the wall layer 31ap and the wall layer 31an. That is, when a concentration of the n-type impurity in the middle of the i-layer in a thickness direction 31 thereof is defined as Cn31, a concentration of the n-type impurity contained in a region on the p-layer 21 side of the i-layer 31 is defined as Cn32, a concentration of the p-type impurity in the middle of the i-layer 31 in the thickness direction thereof is defined as Cp31, and a concentration of the p-type impurity contained in a region on the n-layer 22 side of the i-layer 31 is defined as Cp32, the relations Cn31<Cn32 and Cp31<Cp32 are satisfied in the solar cell 30.

Figure 6:
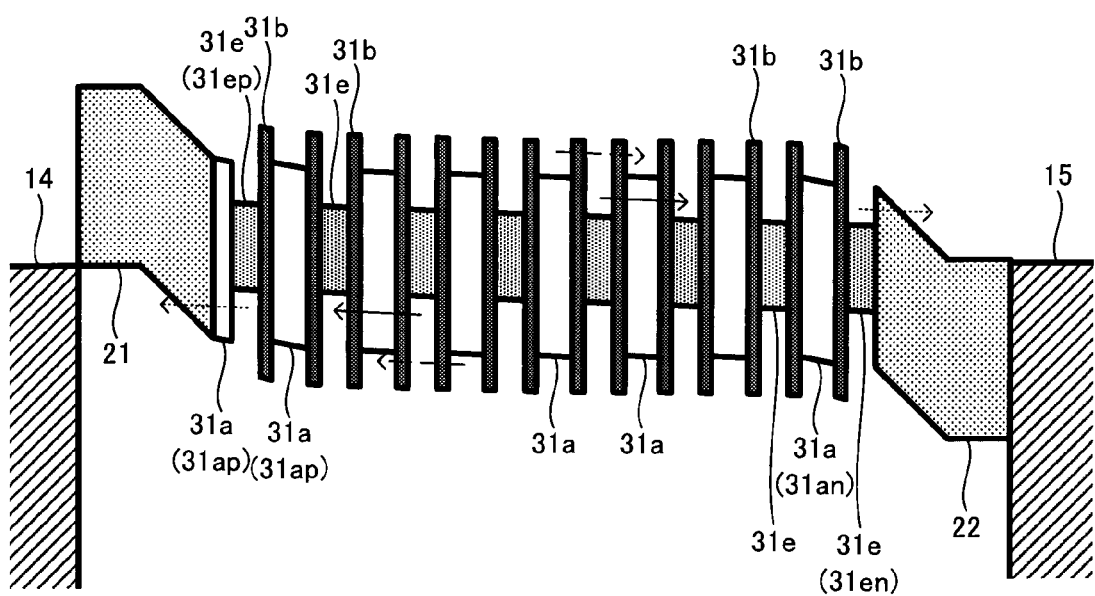
FIG. 6 is a band diagram showing the solar cell 30.

FIG. 6 is a band diagram of the solar cell 30. The energy of an electron is higher on the upper side of the sheet of FIG. 6, and the energy of a hole is higher on the lower side of the sheet. In FIG. 6, the reference numerals corresponding to each element of the solar cell 30 are given, and some of the numerals are omitted. In FIG. 6, the arrow from the left side of the sheet to the right side shows a traveling pattern of an electron; and the arrow from the right side of the sheet to the left side shows a traveling pattern of a hole. Hereinafter, the explanations of the solar cell 30 will be continued with reference to FIGS. 5 and 6.

As shown in FIG. 6, in the solar cell 30, an internal electric field is generated by the p-layer 21 and the n-layer 22, and the band is inclined. And the band inclination of the i-layer 31, in other words, the band inclination of the wall layer 31a and the band inclination of the layer 31e (the band inclination of the wet layer 31c and the quantum dot 31d) are made gentle by the n-type impurity contained in the wall layer 31ap and by the p-type impurity contained in the wall layer 31an. Further, as shown in FIG. 6, the energy level at the lower end of the conduction band of the end face on the second electrode 15 side of the n-layer 22 is positioned below the ground level (i.e. a ground level at which an electron can exist) of the layer 31en disposed in the end portion on the n-layer 22 side of the i-layer 31. The energy level at the upper end of the valence band of the end face on the first electrode 14 side of the p-layer 21 is positioned above the ground level (i.e. a ground level at which a hole can exist) of the layer 31ep disposed in the end portion on the p-layer 21 side of the i-layer 31.

Furthermore, in the solar cell 30, the bad gap of a material constituting the barrier 31b is wider than that of the first semiconductor constituting the wall layer 31a. There is a gap between the lower end of the conduction band in the barrier 31b and the lower end of the conduction band in the wall layer 31a; and between the upper end of the valence band in the barrier 31b and the upper end of the valence band of the wall layer 31a. And there is a gap between the lower end of the conduction band in the barrier 31b and the lower end of the conduction band in the wall layer 31e; and between the upper end of the valence band in the barrier 31b and the upper end of the valence band of the wall layer 31e. These gaps are larger than the thermal energy which the carrier absorbs under the temperature environment where the solar cell 30 is used; and have a height at which to enable the carrier generated in the layer 31e to be transferred between the adjacent layers 31e, 31e, by tunneling conduction.

In the solar cell 30, when the light is made incident upon the i-layer 31, an electron-hole pair is generated in both the wall layer 31a and the layer 31e (the wet layer 31c and the quantum dot 31d). Here, as described above, the gap between the wall layer 31a and the barrier 31b is larger than the thermal energy which the carrier absorbs. Thus, when the carrier generated in the wall layer 31a moves in the middle portion of the i-layer 31 in the thickness direction thereof, the barrier 31b prevents the carrier from falling into the layer 31e (the wet layer 31c and the quantum dot 31d). Consequently, the carrier can drift inside the wall layer 31a which is sandwiched by the barriers 31b, 31b; and can pass through the laminate of the barrier 31b and the layer 31e disposed in the middle portion of the i-layer 31 in the thickness direction thereof, by tunneling conduction. In this manner, the hole having reached the end portion on the p-layer 21 side of the i-layer 31 (i.e. the layer 31ap in contact with the p-layer 21) moves directly to the p-layer 21. By contrast, the electron having reached the layer 31an passes through the barrier 31b and the layer 31en and moves to the n-layer 22, by tunneling conduction. On the other hand, the carrier generated in the layer 31e moves among the layers 31e, 31e, . . . by tunneling conduction, the hole reaching the layer 31ep, and the electron reaching the layer 31en.

As shown in FIGS. 5 and 6, in the solar cell 30, the barrier 31b is not disposed between the layer 31ep and the p-layer 21, and between the layer 31en and the n-layer 22. Hence, the hole existing in the layer 31ep can be transferred to the p-layer 21 by tunneling conduction, without being obstructed by the barrier 31b. Likewise, the electron existing in the layer 31en can be transferred to the n-layer 22 by tunneling conduction, without being obstructed by the barrier 31b. Herein, the layer 31e (including the layer 31ep and the layer 31en) constituted by the wet layer 31c and the quantum dot 31d has a discrete quantum level; and the number of the carriers that each of the layers 31e, 31e, . . . can incorporate is limited. Further, it is assumed that the hole is incorporated into the layer 31ep from the deep level (i.e. a quantum level at which the energy is relatively low); and that the electron is also incorporated into the layer 31en from the deep level (i.e. a quantum level at which the energy is relatively low). Therefore, the hole which is incorporated into the layer 31ep after the hole that has already been incorporated, enters the shallow level (i.e. a quantum level at which the energy is relatively high) of the layer 31ep; and the electron which is incorporated into the layer 31en after the electron that has already been incorporated, enters the shallow level (i.e. a quantum level at which the energy is relatively high) of the layer 31en. The energy barrier is low for the hole having entered the shallow level of the layer 31bp to pass through in order to move to the p-layer 21; and the distance to pass through is short. Thus, the hole can easily move from the layer 31ep to the p-layer 21 by tunneling conduction. Likewise, the energy barrier is low for the electron having entered the shallow level of the layer 31en to pass through in order to move to the n-layer 12; and the distance to pass through is short. Thus, the electron can easily move from the layer 31en to the n-layer 22 by tunneling conduction. In this way, in the solar cell 30 comprising the layer 31ep and the layer 31en, the transfer of the hole to the p-layer 21 by tunneling conduction and the transfer of the electron to the n-layer 22 by tunneling conduction are not hindered by the barrier 31b; thereby it is possible to easily take out the carrier from the layer 31ep and the layer 31en constituted by the wet layer 31c and the quantum dot 31d. And by making it easy to take out the carrier from the wet layer and the quantum dot, the photoelectric conversion efficiency can be improved. Thus, according to the present invention, it is possible to provide the solar cell 30 which is capable of improving the photoelectric conversion efficiency.

As described above, the quantum dot 31d has a discrete quantum level; and the quantum level of the quantum dot especially on the lower energy side is more discrete than that of the other quantum structures (such as a quantum well and quantum wire). Further, it is assumed that the time required for the carrier to relax its energy among the discrete quantum levels is longer that the time required for the carrier to relax its energy among the continuous quantum levels. Thus, with the solar cell 30 provided with the quantum 31d, it is possible to elongate the time period in which the electron and the hole are recombined; as a result, the photoelectric conversion efficiency can be easily improved.

Further, the gradient of the carrier concentration in a direction of electric current is generated in the wall layer 31a of the solar cell 30. In the p-layer 21 or in the end portion on the p-layer 21 side of the i-layer 31, the electron is the minority carrier; and in the n-layer 22 or in the end portion on the n-layer 22 side of the i-layer 31, the hole is the minority carrier. Thus, even if the barrier 31b is not disposed on the p-layer 21 side of the layer 31ep, a large number of electrons do not fall into the layer 31ep, and a large energy loss thereby does not occur. Likewise, even if the barrier 31b is not disposed on the n-layer 22 side of the layer 31en, a large number of holes do not fall into the layer 31en, and a large energy loss thereby does not occur.

In the solar cell 30, the wall layer 31a can be constituted by the same material as that of the wall layer 23a of the solar cell 20; and the layer 31e (the wet layer 31c and the quantum dot 31d) can be constituted by the same material as that of the quantum dot 23b of the solar cell 20. Further, in the solar cell 30, the barrier 31b can be constituted by a material having a band gap wider than that of the material to constitute the wall layer 31a. Furthermore, in the solar cell 30, the i-layer 31 can be produced by repeating the steps of: forming the layer 31en by the MBE method, on the top face of the layer 22 formed on the surface of the electrode 15 by the MBE method or the like; forming the barrier 31b by the MBE method, on the top face of the layer 31en thus formed; and forming the wall layer 31a by the MBE method on the top face of the barrier 31b thus formed; and by finally forming the wall layer 31a on the top face of the layer 31ep, after repeating the above steps. In addition, the n-layer 22, the electrode 14, and the electrode 15 can be produced in the same manner as in the case of the solar cell 20.

In the above description of the solar cell of the present invention, the embodiment has been shown in which the energy level at the lower end of the conduction band of the end face on the second electrode side of the n-layer is at or below the ground level (i.e. a ground level at which an electron can be incorporated) of the quantum structure portion disposed in the end portion on the n-layer side of the i-layer. However, the solar cell of the present invention is not limited to this embodiment. In the solar cell of the present invention, the energy level at the lower end of the conduction band of the end face on the second electrode side of the n-layer may be higher than the ground level (i.e. a ground level at which an electron can be incorporated) of the quantum structure portion disposed in the end portion on the n-layer side of the i-layer. However, in order that the electron incorporated in the quantum level of the quantum structure portion disposed in the end portion on the n-layer side of the i-layer is easily transferred to the n-layer by tunneling conduction, the energy level at the lower end of the conduction band of the end face on the second electrode side of the n-layer is preferably at or below the ground level (i.e. a ground level at which an electron can be incorporated) of the quantum structure portion disposed in the end portion on the n-layer side of the i-layer.

Further, in the above description of the solar cell of the present invention, the embodiment has been shown in which the energy level at the upper end of the valence band of the end face on the first electrode side of the p-layer is at or above the ground level (i.e. a ground level at which a hole can be incorporated) of the quantum structure portion disposed in the end portion on the p-layer side of the i-layer. However, the solar cell of the present invention is not limited to this embodiment. In the solar cell of the present invention, the energy level at the upper end of the valence band of the end face on the first electrode side of the p-layer may be below the ground level (i.e. a ground level at which a hole can be incorporated) of the quantum structure portion disposed in the end portion on the p-layer side of the i-layer. However, in order that the hole incorporated in the quantum level of the quantum structure portion disposed in the end portion on the p-layer side of the i-layer is easily transferred to the p-layer by tunneling conduction, the energy level at the upper end of the valence band of the end face on the first electrode side of the p-layer is preferably at or above the ground level (i.e. a ground level at which a hole can be incorporated) of the quantum structure portion disposed in the end portion on the p-layer side of the i-layer.

4. A Fourth Embodiment

Figure 7:
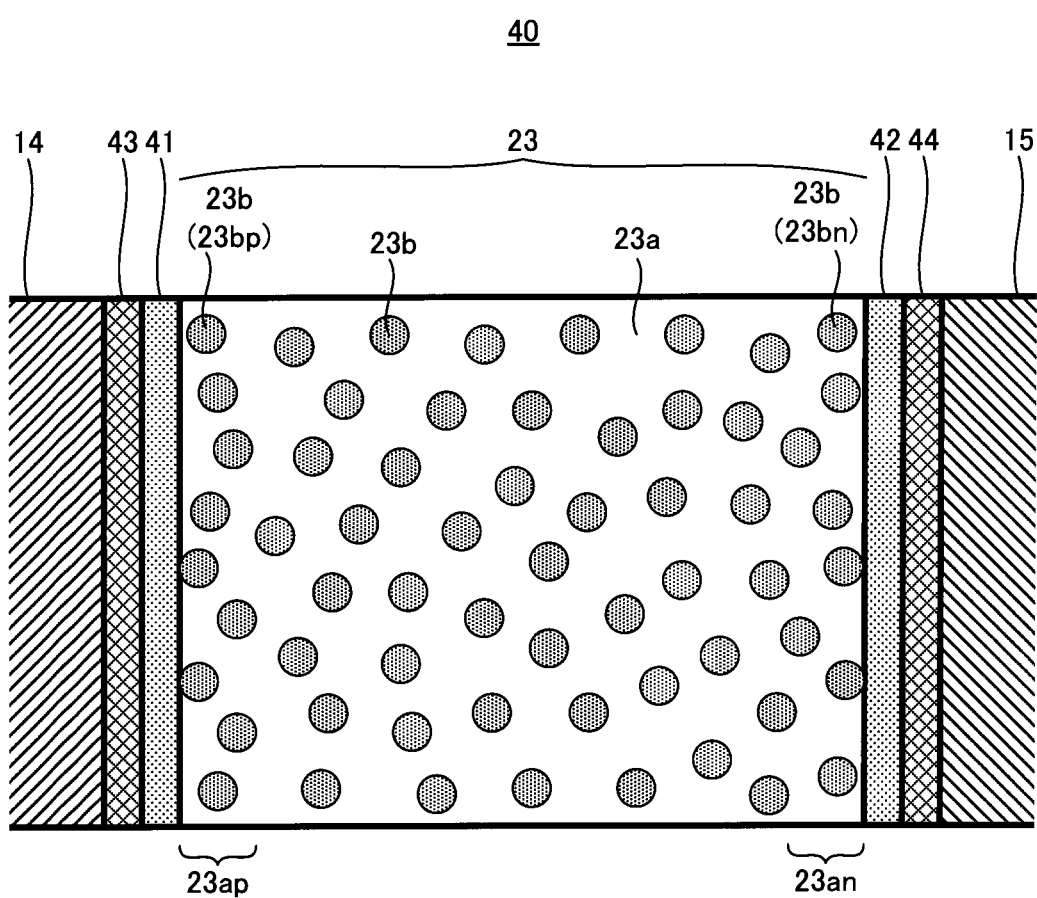
FIG. 7 is a cross-sectional view illustrating an embodiment of a solar cell 40.

FIG. 7 is a cross-sectional view illustrating a solar cell 40 in accordance with a fourth embodiment. Some of the reference numerals are omitted in FIG. 7. In FIG. 7, to the elements having the same structure as those in the solar cell 20, the same reference numerals as those used in FIGS. 3 and 4 are given, and the explanations thereof are adequately omitted.

As shown in FIG. 7, the solar cell 40 comprises: a p-layer 41; an n-layer 42; an i-layer 23 disposed between the p-layer 41 and the n-layer 42; a p$^+$-layer 43 connected to the p-layer 41; a first electrode 14 connected to the p$^+$-layer 43; an n$^+$-layer 44 connected to the n-layer 42; and a second electrode 15 connected to the n$^+$-layer 44. The p-layer 41 is constituted by the same material as that of the p-layer 21 of the solar cell 20. A thickness of the p-layer 41 is less than that of the p-layer 21 of the solar cell 20; and a hole concentration of the p-layer 41 is approximately the same as that of the p-layer 21. In addition, the n-layer 42 is constituted by the same material as that of the n-layer 22 of the solar cell 20. A thickness of the n-layer 42 is less than the n-layer 22 of the solar cell 20; and an electron concentration of the n-layer 42 is approximately the same as that of the n-layer 22. The i-layer 23 comprises a wall layer 23a, and a quantum dot 23b disposed in the wall layer 23a. The wall layer 23a is constituted by a first semiconductor. An n-type impurity is contained in the wall layer 23ap; a p-type impurity is contained in the wall layer 23an. In contrast, the n-type impurity and the p-type impurity are not contained in the region of the wall layer 23a other than the wall layer 23ap and the wall layer 23an. That is, when a concentration of the n-type impurity in the middle of the i-layer 23 in a thickness direction thereof is defined as Cn41, a concentration of the n-type impurity contained in a region on the p-layer 41 side of the i-layer 23 is defined as Cn42, a concentration of the p-type impurity in the middle of the i-layer 23 in the thickness direction thereof is defined as Cp41, and a concentration of the p-type impurity contained in a region on the n-layer 42 side of the i-layer 23 is defined as Cp42, the relations Cn41<Cn42 and Cp41<Cp42 are satisfied in the solar cell 40. Further, the quantum dot 23b is constituted by a second semiconductor having a band gap narrower than that of the first semiconductor; and a spacing between the adjacent quantum dots 23b, 23b is configured to permit a carrier to be transferred by tunneling conduction. Furthermore, a hole concentration of the p$^+$-layer 43 disposed between the p-layer 41 and the first electrode 14 is higher than that of the p-layer 41; and the p$^+$-layer 43 is constituted by a semiconductor having a band gap wider than that of the semiconductor constituting the p-layer 41. An electron concentration of the n$^+$-layer 44 disposed between the n-layer 42 and the second electrode 15 is higher than that of the n-layer 42; and the n$^+$-layer 44 is constituted by a semiconductor having a band gap wider than that of the semiconductor constituting the n-layer 42.

Figure 8:
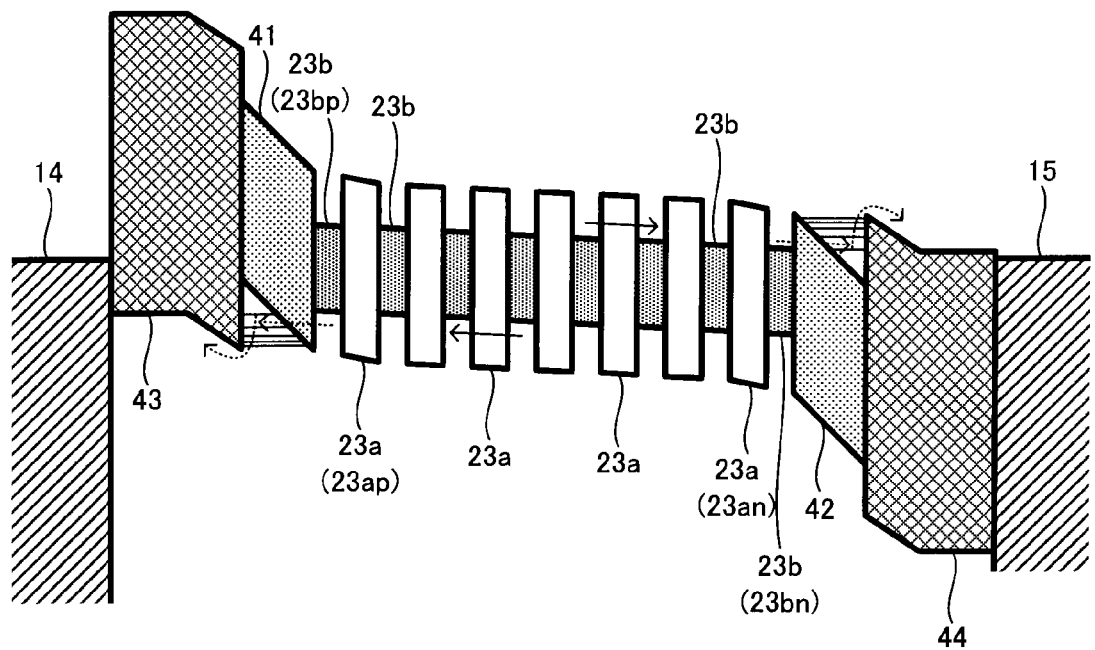
FIG. 8 is a band diagram showing the solar cell 40.

FIG. 8 is a band diagram of the solar cell 40. The energy of an electron is higher on the upper side of the sheet of FIG. 8, and the energy of a hole is higher on the lower side of the sheet. In FIG. 8, the reference numerals corresponding to each element of the solar cell 40 are given, and some of the numerals are omitted. In FIG. 8, the arrow from the left side of the sheet to the right side shows a traveling pattern of an electron; and the arrow from the right side of the sheet to the left side shows a traveling pattern of a hole. Hereinafter, the explanations of the solar cell 40 will be continued with reference to FIGS. 7 and 8.

As shown in FIG. 8, in the solar cell 40, an internal electric field is generated by the p-layer 41 and the n-layer 42, and the band is inclined. And the band inclination of the i-layer 23, in other words, the band inclination of the wall layer 23a and the band inclination of the quantum dot 23b are made gentle by the n-type impurity contained in the wall layer 23ap and by the p-type impurity contained in the wall layer 23an. In addition, since the solar cell 40 comprises the p-layer 41 having a high hole concentration, and the n-layer 42 having a high electron concentration, the band inclinations of the upper end of the valence band in the p-layer 41 and the lower end of the conduction band in the n-layer 42 are steep.

In the solar cell 40, the p$^+$-layer 43 is disposed between the p-layer 41 and the first electrode 14; and the n$^+$-layer 44 is disposed between the n-layer 42 and the second electrode 15. As shown in FIG. 8, a band gap of a semiconductor constituting the p$^+$-layer 43 is wider than that of the semiconductor constituting the p-layer 41. The energy level at the upper end of the valence band of the end face on the p-layer 41 side of the p$^+$-layer 43 is positioned below the energy level at the upper end of the valence band of the end face on the p$^+$-layer 43 side of the p-layer 41. By disposing between the p-layer 41 and the first electrode 14, the p$^+$-layer 43 which has such properties and which is constituted by the semiconductor material having a hole concentration higher than that of the p-layer 41, in the solar cell 40, a triangular potential having a quantum level is formed in the valence band of the p-layer 41. The triangular potential formed in the valence band of the p-layer 41 has a plurality of quantum levels. A ground level of the quantum level formed in the valence band of the p-layer 41 is positioned below the energy level at the upper end of the valence band of the end face on the p$^+$-layer 43 side of the p-layer 41. A hole concentration and thickness of the p-layer 41, and a hole concentration and thickness of the p$^+$-layer 43 are controlled so that the ground level becomes approximately equal to the energy level at the upper end of the valence band of the end face on the first electrode 14 side of the p$^+$-layer 43.

On the other hand, as shown in FIG. 8, a band gap of a semiconductor constituting the n$^+$-layer 44 is wider than that of the semiconductor constituting the n-layer 42. The energy level at the lower end of the conduction band of the end face on the n-layer 42 side of the n$^+$-layer 44 is positioned above the energy level at the lower end of the conduction band of the end face on the n$^+$-layer 44 side of the n-layer 42. By disposing between the n-layer 42 and the second electrode 15, the n$^+$-layer 44 which has such properties and which is constituted by the semiconductor material having an electron concentration higher than that of the n-layer 42, in the solar cell 40, a triangular potential having a quantum level is formed in the conduction band of the n-layer 42. The triangular potential formed in the conduction band of the n-layer 42 has a plurality of quantum levels. A ground level of the quantum level formed in the conduction band of the n-layer 42 is positioned above the energy level at the lower end of the conduction band of the end face on the n$^+$-layer 44 side of the n-layer 42. An electron concentration and thickness of the n-layer 42, and an electron concentration and thickness of the n$^+$-layer 44 are controlled so that the ground level becomes approximately equal to the energy level at the lower end of the conduction band of the end face on the second electrode 15 side of the n$^+$-layer 44.

Further, as shown in FIG. 8, in the solar cell 40, the energy level at the lower end of the conduction band in the p$^+$-layer 43 is positioned above the energy level at the lower end of the conduction band in the p-layer 41. And the energy level at the upper end of the valence band in the n⁺-layer 44 is positioned below the energy level at the upper end of the valence band in the n-layer 42.

In the solar cell 40, when the light is made incident upon the i-layer 23, an electron-hole pair is generated in both the wall layer 23a and the quantum dot 23b. At least a part of the carriers generated in the wall layer 23a drift in the wall layer 23a, the hole reaching the wall layer 23ap, and the electron reaching the wall layer 23an. And at least a part of the holes having reached the wall layer 23ap directly reach the p-layer 41, whereas at least a part of the remaining holes having reached the wall layer 23ap fall into the quantum dot 23bp. Further, at least a part of the electrons having reached the wall layer 23an directly reach the n-layer 42, whereas at least a part of the remaining electrons having reached the wall layer 23an fall into the quantum dot 23bn. Here, as described above, in the solar cell 40, a quantum level is formed in the valence band of the p-layer 41, and a quantum level is formed also in the conduction band of the n-layer. Hence, the hole having reached the p-layer 41 from the wall layer 23ap is incorporated into the quantum level formed in the valence band of the p-layer 41. As shown in FIG. 8, the quantum level formed in the valence band of the p-layer 41 is positioned above the energy level at the upper end of the valence band of the end face on the p-layer 41 side of the p⁺-layer 43. Thus, the hole incorporated into the quantum level formed in the valence band of the p-layer 41 reaches the p⁺-layer 43 by being thermally excited. In contrast, the electron having reached the n-layer 42 from the wall layer 23an is incorporated into the quantum level formed in the conduction band of the n-layer 42. As shown in FIG. 8, the quantum level formed in the conduction band of the n-layer 42 is positioned below the energy level at the lower end of the conduction band of the end face on the n-layer 42 side of the n⁺-layer 44. Thus, the electron incorporated into the quantum level formed in the conduction band of the n-layer 42 reaches the n⁺-layer 44 by being thermally excited.

On the other hand, as described above, a band gap of the second semiconductor constituting the quantum dot 23b is narrower than that of the first semiconductor constituting the wall layer 23a. So, at least a part of the carriers generated in the wall layer 23a fall into the quantum dot 23b. Here, in the solar cell 40, the energy difference between the quantum levels of the adjacent quantum dots 23b, 23b is reduced by containing the n-type impurity in the wall layer 23ap and the p-type impurity in the wall layer 23an. Thus, the carriers having fallen into the quantum dot 23b can easily move among the quantum dots 23b, 23b, . . . by tunneling conduction, the hole reaching the quantum dot 23bp, and the electron reaching the quantum dot 23bn. On the other hand, the carriers generated in the quantum dot 23b likewise move among the quantum dots 23b, 23b, . . . by tunneling conduction, the hole reaching the quantum dot 23bp, and the electron reaching the quantum dot 23bn. The hole having reached the quantum dot 23bp in this manner is transferred by tunneling conduction, thereby being incorporated into the quantum level formed in the valence band of the p-layer 41. And the hole incorporated into this quantum level is thermally excited, thereby reaching the p⁺-layer 43. In contrast, the electron having reached the quantum dot 23bn is transferred by tunneling conduction, thereby being incorporated into the quantum level formed in the conduction band of the n-layer 42. And the electron incorporated into this quantum level is thermally excited, reaching the n⁺-layer 44.

In this way, according to the solar cell 40, the hole can be transferred to the p⁺-layer 43 through the quantum level formed in the valence band of the p-layer 41; and the electron can be transferred to the n⁺-layer 44 through the quantum level formed in the conduction band of the n-layer 42. Herein, the ground level of the quantum level formed in the valence band of the p-layer 41 is positioned below the upper end of the valence band of the end face on the p⁺-layer 43 side of the p-layer 41. So, it is possible to reduce the energy loss of the hole by transferring it through the quantum level formed in the valence band of the p-layer 41. In addition, the ground level of the quantum level formed in the valence band of the p-layer 41 is approximately equal to the energy level at the upper end of the valence band of the end face on the first electrode 14 side of the p⁺-layer 43. So, according to the solar cell 40, it is possible to reduce the energy loss caused at a time when the hole incorporated into the quantum level formed in the valence band of the p-layer 41 moves to the p⁺-layer 43.

Likewise, the ground level of the quantum level formed in the conduction band of the n-layer 42 is positioned above the lower end of the conduction band of the end face on the n⁺-layer 44 side of the n-layer 42. So, it is possible to reduce the energy loss of the electron by transferring it through the quantum level formed in the conduction band of the n-layer 42. In addition, the ground level of the quantum level formed in the conduction band of the n-layer 42 is approximately equal to the energy level at the lower end of the conduction band of the end face on the second electrode 15 side of the n⁺-layer 44. Thus, according to the solar cell 40, it is possible to reduce the energy loss caused at a time when the electron incorporated into the quantum level formed in the conduction band of the n-layer 42 moves to the n⁺-layer 44. Furthermore, in the solar cell 40, the energy level at the lower end of the conduction band in the p⁺-layer 43 is positioned above the energy level at the lower end of the conduction band in the p-layer 41; so, it is possible to prevent the electron as the minority carrier in the vicinity of the p-layer 41 from moving to the first electrode 14. Likewise, in the solar cell 40, the energy level at the upper end of the valence band in the n⁺-layer 44 is positioned below the energy level at the upper end of the valence band in the n-layer 42; so, it is possible to prevent the hole as the minority carrier in the vicinity of the n-layer 42 from moving to the second electrode 15. Therefore, according to the solar cell 40, it is possible to prevent the recombination of the electron and the hole better than in the case of the solar cell 20.

In the solar cell 40, the p-layer 41 can be constituted in the same manner as the p-layer 21 of the solar cell 20, except that the p-layer 41 is made thinner than the p-layer 21 of the solar cell 20. Further, the n-layer 42 can be produced in the same manner as the n-layer 22 of the solar cell 20, except that the n-layer 42 is made thinner than the n-layer 22 of the solar cell 20. The p⁺-layer 43 can be constituted, for example by a material obtained by doping into a semiconductor material having a band gap wider than that of the semiconductor to constitute the wall layer 23a, more amount of p-type impurity than in the case of the p-layer 41. Further, the n⁺-layer 44 can be constituted, for example by a material obtained by doping into a semiconductor material having a band gap wider than that of the semiconductor to constitute the wall layer 23a, more amount of n-type impurity than in the case of the n-layer 42. In the solar cell 40, the p-layer 41 and the p⁺-layer 43 can be produced in the same manner as the p-layer 21 of the solar cell 20; and the n-layer 42 and the n⁺-layer 44 can be produced in the same manner as the n-layer 22 of the solar cell 20. In addition, the i-layer 23, the first electrode 14, and the second electrode 15 can be produced in the same manner as in the case of the solar cell 20.

5. A Fifth Embodiment

Figure 9:
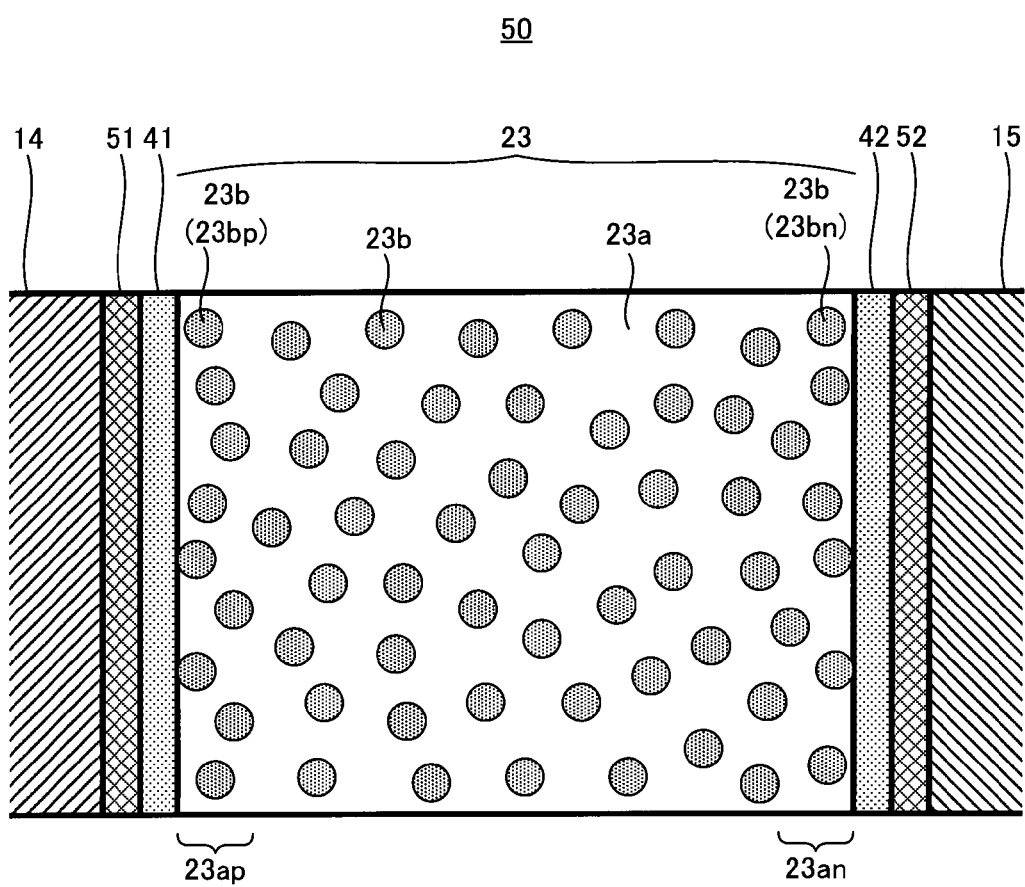
FIG. 9 is a cross-sectional view illustrating an embodiment of a solar cell 50.

FIG. 9 is a cross-sectional view illustrating a solar cell 50 in accordance with a fifth embodiment. Some of the reference numerals are omitted in FIG. 9. In FIG. 9, to the elements having the same structure as those in the solar cell 40, the same reference numerals as those used in FIGS. 7 and 8 are given, and the explanations thereof are adequately omitted.

As shown in FIG. 9, the solar cell 50 comprises: a p-layer 41; an n-layer 42; an i-layer 23 disposed between the p-layer 41 and the n-layer 42; a $p^+$-layer 51 connected to the p-layer 41; a first electrode 14 connected to the $p^+$-layer 51; an $n^+$-layer 52 connected to the n-layer 42; and a second electrode 15 connected to the $n^+$-layer 52. The i-layer 23 comprises a wall layer 23a, and a quantum dot 23b disposed in the wall layer 23a. The wall layer 23a is constituted by a first semiconductor. An n-type impurity is contained in the wall layer 23ap; a p-type impurity is contained in the wall layer 23an. In contrast, the n-type impurity and the p-type impurity are not contained in the region of the wall layer 23a other than the wall layer 23ap and the wall layer 23an. That is, when a concentration of the n-type impurity in the middle of the i-layer 23 in a thickness direction thereof is defined as Cn51, a concentration of the n-type impurity contained in a region on the p-layer 41 side of the i-layer 23 is defined as Cn52, a concentration of the p-type impurity in the middle of the i-layer 23 in the thickness direction thereof is defined as Cp51, and a concentration of the p-type impurity contained in a region on the n-layer 42 side of the i-layer 23 is defined as Cp52, the relations Cn51<Cn52 and Cp51<Cp52 are satisfied in the solar cell 50.

Further, the quantum dot 23b is constituted by a second semiconductor having a band gap narrower than that of the first semiconductor; and a spacing between the adjacent quantum dots 23b, 23b is configured to permit a carrier to be transferred by tunneling conduction. Furthermore, a hole concentration of the $p^+$-layer 51 disposed between the p-layer 41 and the first electrode 14 is higher than that of the $p^+$-layer 43 of the solar cell 40; and the $p^+$-layer 51 is constituted by a semiconductor having a band gap wider than that of the semiconductor constituting the p-layer 41. An electron concentration of the $n^+$-layer 52 disposed between the n-layer 42 and the second electrode 15 is higher than that of the $n^+$-layer 44 of the solar cell 40; and the $n^+$-layer 52 is constituted by a semiconductor having a band gap wider than that of the semiconductor constituting the n-layer 42.

Figure 10:
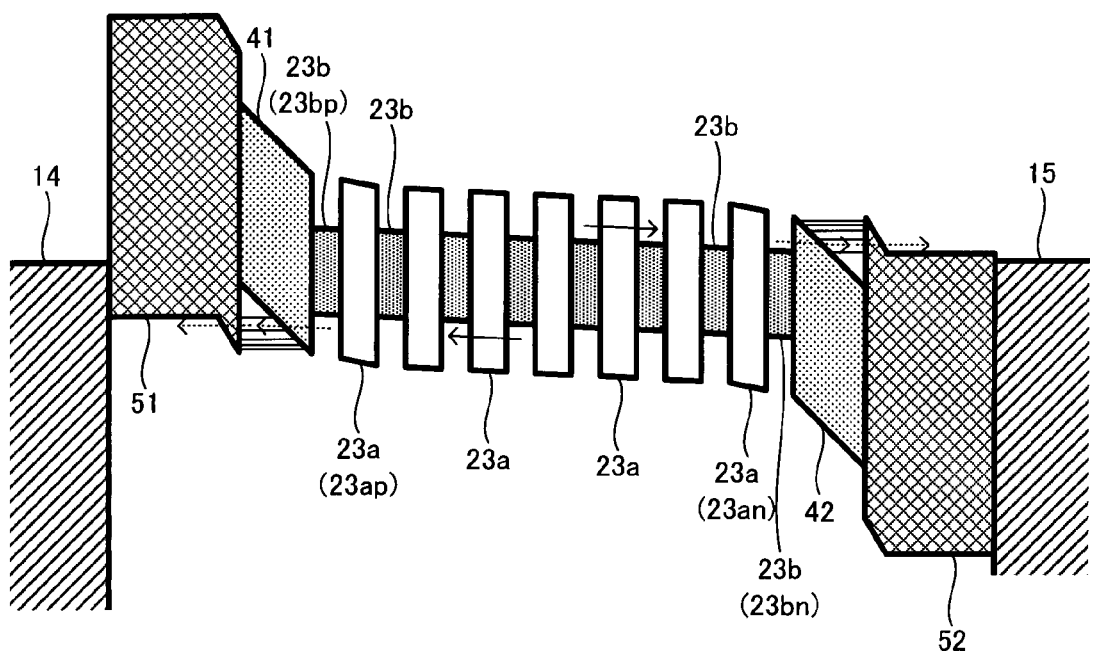
FIG. 10 is a band diagram showing the solar cell 50.

FIG. 10 is a band diagram of the solar cell 50. The energy of an electron is higher on the upper side of the sheet of FIG. 10, and the energy of a hole is higher on the lower side of the sheet. In FIG. 10, the reference numerals corresponding to each element of the solar cell 50 are given, and some of the numerals are omitted. In FIG. 10, the arrow from the left side of the sheet to the right side shows a traveling pattern of an electron; and the arrow from the right side of the sheet to the left side shows a traveling pattern of a hole. Hereinafter, the explanations of the solar cell 50 will be continued with reference to FIGS. 7 to 10.

As shown in FIG. 10, in the solar cell 50, an internal electric field is generated by the p-layer 41 and the n-layer 42, and the band is inclined. And the band inclination of the i-layer 23, in other words, the band inclination of the wall layer 23a and the band inclination of the quantum dot 23b are made gentle by the n-type impurity contained in the wall layer 23ap and by the p-type impurity contained in the wall layer 23an. In the solar cell 50, the $p^+$-layer 51 is disposed between the p-layer 41 and the first electrode 14; and the $n^+$-layer 52 is disposed between the n-layer 42 and the second electrode 15. As shown in FIG. 10, a band gap of the semiconductor constituting the $p^+$-layer 51 is wider than that of the semiconductor constituting the p-layer 41. The energy level at the upper end of the valence band of the end face on the p-layer 41 side of the $p^+$-layer 51 is positioned below the energy level at the upper end of the valence band of the end face on the $p^+$-layer 51 side of the p-layer 41. By disposing between the p-layer 41 and the first electrode 14, the $p^+$-layer 51 which has such properties and which is constituted by the semiconductor material having a hole concentration higher than that of the $p^+$-layer 43 of the solar cell 40, in the solar cell 50, a triangular potential having a quantum level is formed in the valence band of the p-layer 41. The triangular potential formed in the valence band of the p-layer 41 has a plurality of quantum levels. A ground level of the quantum level formed in the valence band of the p-layer 41 is positioned below the energy level at the upper end of the valence band of the end face on the $p^+$-layer 51 side of the p-layer 41. A hole concentration and thickness of the p-layer 41, and a hole concentration and thickness of the $p^+$-layer 51 are controlled so that the ground level becomes approximately equal to the energy level at the upper end of the valence band of the end face on the first electrode 14 side of the $p^+$-layer 51.

On the other hand, as shown in FIG. 10, a band gap of the semiconductor constituting the $n^+$-layer 52 is wider than that of the semiconductor constituting the n-layer 42. The energy level at the lower end of the conduction band of the end face on the n-layer 42 side of the $n^+$-layer 52 is positioned above the energy level at the lower end of the conduction band of the end face on the $n^+$-layer 52 side of the n-layer 42. By disposing between the n-layer 42 and the second electrode 15, the $n^+$-layer 52 which has such properties and which is constituted by the semiconductor material having an electron concentration higher than that of the $n^+$-layer 44 of the solar cell 40, in the solar cell 50, a triangular potential having a quantum level is formed in the conduction band of the n-layer 42. The triangular potential formed in the conduction band of the n-layer 42 has a plurality of quantum levels. A ground level of the quantum level formed in the conduction band of the n-layer 42 is positioned above the energy level at the lower end of the conduction band of the end face on the $n^+$-layer 52 side of the n-layer 42. An electron concentration and thickness of the n-layer 42, and an electron concentration and thickness of the $n^+$-layer 52 are controlled so that the ground level becomes approximately equal to the energy level at the lower end of the conduction band of the end face on the second electrode 15 side of the $n^+$-layer 52.

Further, as shown in FIG. 10, in the solar cell 50, the energy level at the lower end of the conduction band in the $p^+$-layer 51 is positioned above the energy level at the lower end of the conduction band in the p-layer 41. And the energy level at the upper end of the valence band in the $n^+$-layer 52 is positioned below the energy level at the upper end of the valence band in the n-layer 42.

Furthermore, the solar cell 50 is provided with the $p^+$-layer 51 having a hole concentration higher than that of the $p^+$-layer 43 of the solar cell 40. So, as shown in FIG. 10, the band inclination of the upper end of the valence band on the p-layer 41 side of the $p^+$-layer 51 is steeper than that of the upper end of the valence band on the p-layer 41 side of the $p^+$-layer 43 of the solar cell 40. With this configuration of the solar cell 50, it is possible to reduce the moving distance of the hole being transferred from the quantum level formed in the valence band of the p-layer 41 to the $p^+$-layer 51 by tunneling conduction. Thus, according to the solar cell 50, the hole existing in the quantum level formed in the valence band of the p-layer 41 can be easily transferred to the $p^+$-layer 51 by tunneling conduction. In this way, according to the solar cell 50, a way of transferring the hole by tunneling conduction can be easily added to the traveling pattern of the hole at a time when the hole existing in the quantum level formed in the valence band of the p-layer 41 is transferred to the p$^+$-layer 51; therefore, the hole can be transferred to the first electrode 14 more easily than in the case of the solar cell 40.

On the other hand, the solar cell 50 is provided with the n$^+$-layer 52 having an electron concentration higher than that of the n$^+$-layer 44 of the solar cell 40. So, as shown in FIG. 10, the band inclination of the lower end of the conduction band on the n-layer 42 side of the n$^+$-layer 52 is steeper than that of the lower end of the conduction band on the n-layer 42 side of the n$^+$-layer 44 of the solar cell 40. With this configuration of the solar cell 50, it is possible to reduce the moving distance of the electron being transferred from the quantum level formed in the conduction band of the n-layer 42 to the n$^+$-layer 52 by tunneling conduction. Thus, according to the solar cell 50, the electron existing in the quantum level formed in the conduction band of the n-layer 42 can be easily transferred to the n$^+$-layer 52 by tunneling conduction. In this way, according to the solar cell 50, a way of transferring the electron by tunneling conduction can be easily added to the traveling pattern of the electron at a time when the electron existing in the quantum level formed in the conduction band of the n-layer 42 is transferred to the n$^+$-layer 52; therefore, the electron can be transferred to the second electrode 15 more easily than in the case of the solar cell 40. Thus, according to the solar cell 50, it is possible to improve the photoelectric conversion efficiency better than in the case of the solar cell 40.

In the solar cell 50, the p$^+$-layer 51 can be constituted, for example by a material obtained by doping into a semiconductor material having a band gap wider than that of the semiconductor to constitute the wall layer 23a, more amount of p-type impurity than in the case of the p$^+$-layer 43 of the solar cell 40. Further, the n$^+$-layer 52 can be constituted, for example by a material obtained by doping into a semiconductor material having a band gap wider than that of the semiconductor to constitute the wall layer 23a, more amount of n-type impurity than in the case of the n$^+$-layer 44 of the solar cell 40. In the solar cell 50, the p$^+$-layer 51 can be produced in the same manner as the p$^+$-layer 43 of the solar cell 40; and the n$^+$-layer 52 can be produced in the same manner as the n$^+$-layer 44 of the solar cell 40. The other elements of the solar cell 50 can be produced in the same manner as in the case of the solar cell 40.

6. A Sixth Embodiment

Figure 11:
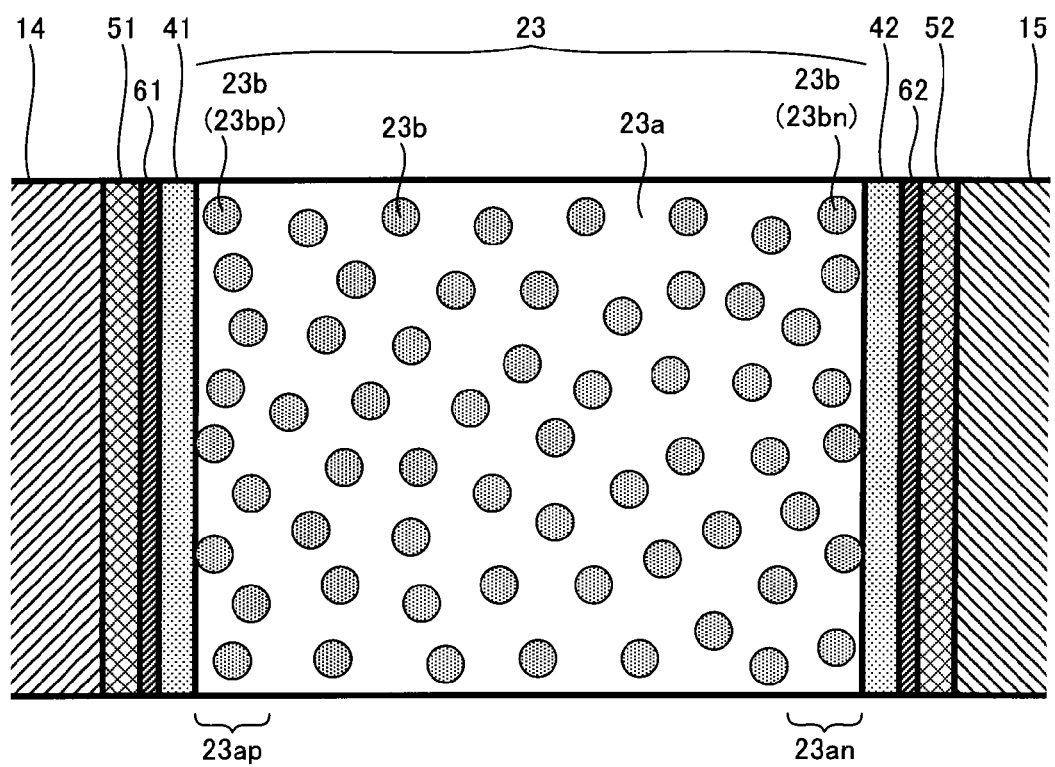
FIG. 11 is a cross-sectional view illustrating an embodiment of a solar cell 60.

FIG. 11 is a cross-sectional view illustrating a solar cell 60 in accordance with a sixth embodiment. Some of the reference numerals are omitted in FIG. 11. In FIG. 11, to the elements having the same structure as those in the solar cell 50, the same reference numeral as those used in FIGS. 9 and 10 are given, and the explanations thereof are adequately omitted.

As shown in FIG. 11, the solar cell 60 comprises: a p-layer 41; an n-layer 42; an i-layer 23 disposed between the p-layer 41 and the n-layer 42; an insulating layer 61 connected to the p-layer 41; a p$^+$-layer 51 connected to the insulating layer 61; a first electrode 14 connected to the p$^+$-layer 51; an insulating layer 62 connected to the n-layer 42; an n$^+$-layer 52 connected to the insulating layer 62; and a second electrode 15 connected to the n$^+$-layer 52. The i-layer 23 comprises a wall layer 23a, and a quantum dot 23b disposed in the wall layer 23a. The wall layer 23a is constituted by a first semiconductor. An n-type impurity is contained in the wall layer 23ap; a p-type impurity is contained in the wall layer 23an. In contrast, the n-type impurity and the p-type impurity are not contained in the region of the wall layer 23a other than the wall layer 23ap and the wall layer 23an. That is, when a concentration of the n-type impurity in the middle of the i-layer 23 in a thickness direction thereof is defined as Cn61, a concentration of the n-type impurity contained in a region on the p-layer 41 side of the i-layer 23 is defined as Cn62, a concentration of the p-type impurity in the middle of the i-layer 23 in the thickness direction thereof is defined as Cp61, and a concentration of the p-type impurity contained in a region on the n-layer 42 side of the i-layer 23 is defined as Cp62, the relations Cn61<Cn62 and Cp61<Cp62 are satisfied in the solar cell 60. Further, the quantum dot 23b is constituted by a second semiconductor having a band gap narrower than that of the first semiconductor; and a spacing between the adjacent quantum dots 23b, 23b is configured to permit a carrier to be transferred by tunneling conduction. Furthermore, the insulating layer 61 disposed between the p-layer 41 and the p$^+$-layer 51 is configured to have a thickness which allows the hole to pass by tunneling conduction; and the insulating layer 62 disposed between the n-layer 42 and the n$^+$-layer 52 is configured to have a thickness which allows the electron to pass by tunneling conduction.

Figure 12:
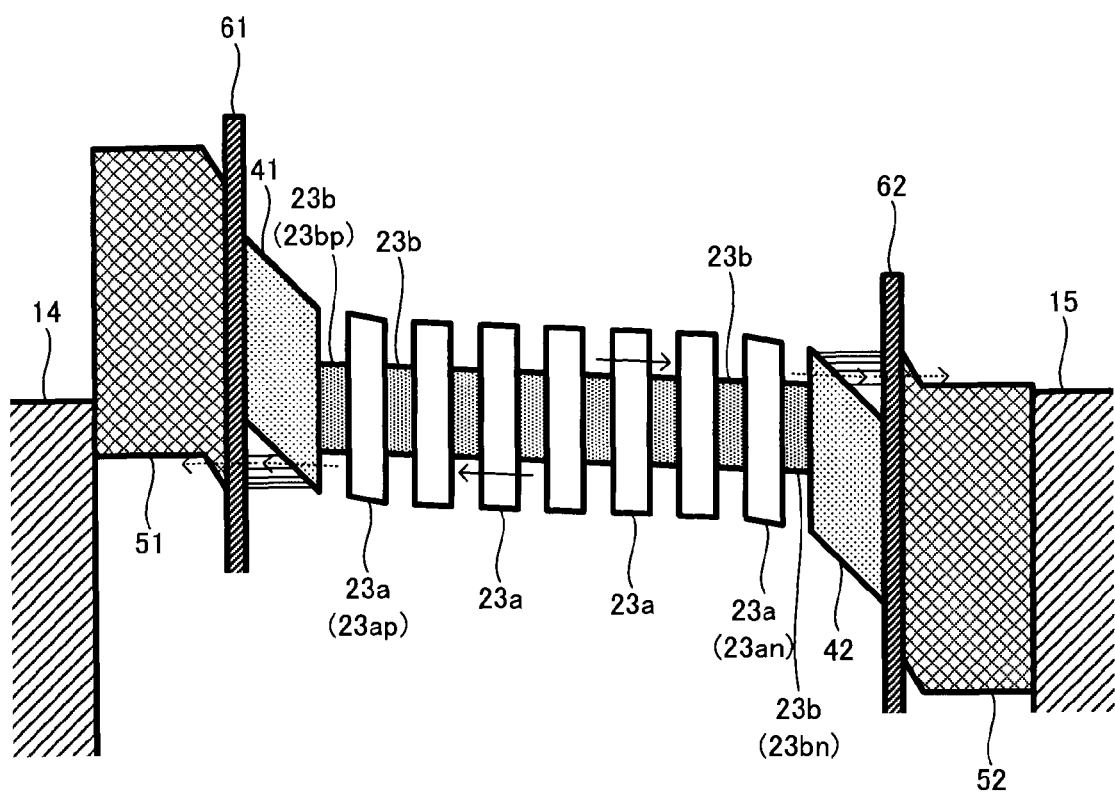
FIG. 12 is a band diagram showing the solar cell 60.

FIG. 12 is a band diagram of the solar cell 60. The energy of an electron is higher on the upper side of the sheet of FIG. 12, and the energy of a hole is higher on the lower side of the sheet. In FIG. 12, the reference numerals corresponding to each element of the solar cell 60 are given, and some of the numerals are omitted. In FIG. 12, the arrow from the left side of the sheet to the right side shows a traveling pattern of an electron; and the arrow from the right side of the sheet to the left side shows a traveling pattern of a hole. Hereinafter, the explanations of the solar cell 60 will be continued with reference to FIGS. 9 to 12.

As shown in FIG. 12, in the solar cell 60, an internal electric field is generated by the p-layer 41 and the n-layer 42, and the band is inclined. And the band inclination of the i-layer 23, in other words, the band inclination of the wall layer 23a and the band inclination of the quantum dot 23b are made gentle by the n-type impurity contained in the wall layer 23ap and by the p-type impurity contained in the wall layer 23an. Further, in the solar cell 60, the insulating layer 61 is disposed between the p-layer 41 and the p$^+$-layer 51. With this configuration, it becomes easy to enlarge the difference between the energy level at the upper end of the valence band of the end face on the p-layer 41 side of the insulating layer 61 and the energy level at the upper end of the valence band of the end face on the insulating layer 61 side of the p-layer 41, thereby enabling easily forming a triangular potential having a quantum level, in the valence band of the p-layer 41. Likewise, in the solar cell 60, the insulating layer 62 is disposed between the n-layer 42 and the n$^+$-layer 52. With this configuration, it becomes easy to enlarge the difference between the energy level at the lower end of the conduction band of the end face on the n-layer 42 side of the insulating layer 62 and the energy level at the lower end of the conduction band of the end face on the insulating layer 62 side of the n-layer 42, thereby enabling easily forming a triangular potential having a quantum level, in the conduction band of the n-layer 42.

As described above, by forming the triangular potential having the quantum level in the valence band of the p-layer 41, it becomes possible to reduce the energy loss of the hole caused at a time when the hole moves from the i-layer 23 to the first electrode 14. Also, by forming the triangular potential having the quantum level in the conduction band of the n-layer 42, it becomes possible to reduce the energy loss of the electron caused at a time when the electron moves from the i-layer 23 to the second electrode 15. Therefore, according to the solar cell 60, the photoelectric conversion efficiency can be easily improved.

In the solar cell 60, a constituent material of the insulator layers 61, 62 is not restricted as long as it enables formation of the triangular potential, and as long as it can resist the environment in which the solar cell is used. For example, GaN, which is a non-doped wide-gap semiconductor, and metal oxide film may be used. Further, a thickness of the insulating layers 61, 62 is not restricted as long as it enables the carrier to pass by tunneling conduction; for example, it may be approximately 2 nm. The insulating layers 61, 62 can be produced by a known method such as the MBE method. The other elements of the solar cell 60 can be produced in the same manner as in the case of the solar cell 50.

7. A Seventh Embodiment

Figure 13:
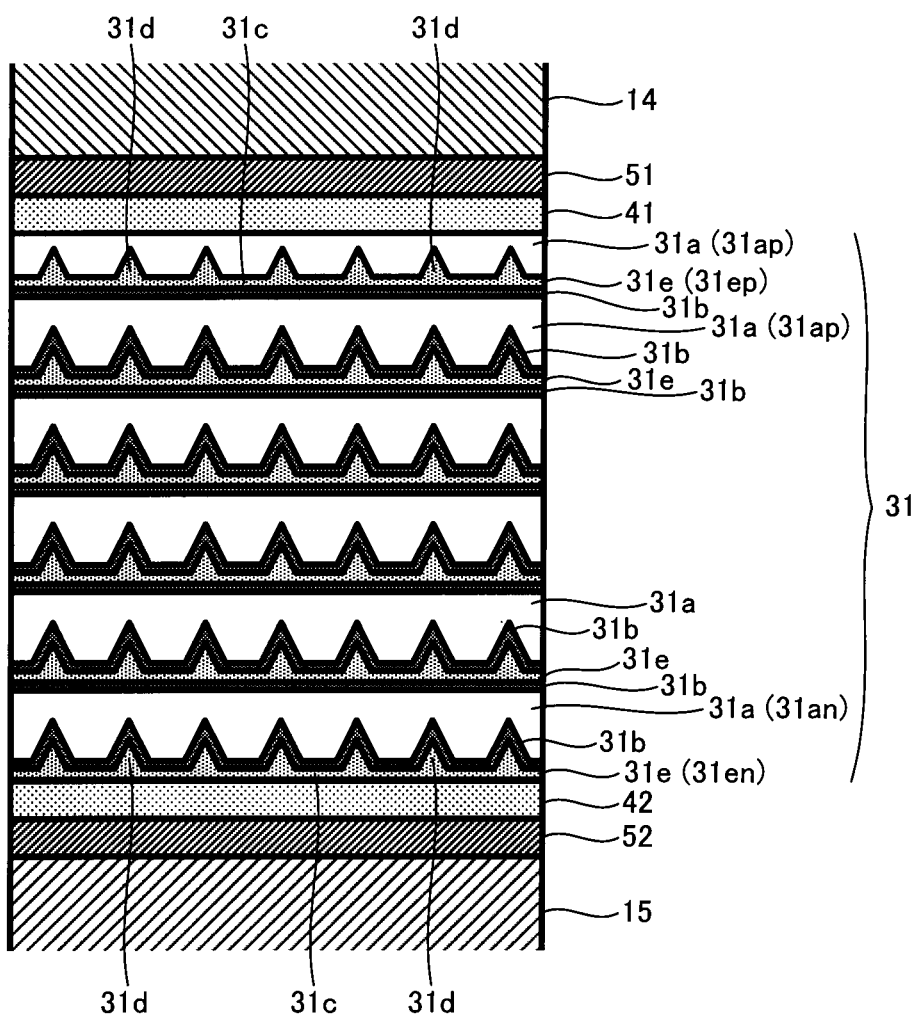
FIG. 13 is a cross-sectional view illustrating an embodiment of a solar cell 70.

FIG. 13 is a cross-sectional view illustrating a solar cell 70 in accordance with a seventh embodiment. Some of the reference numerals are omitted in FIG. 13. In FIG. 13, to the elements having the same structure as those in the solar cell 30 or in the solar cell 50, the same reference numerals as those used in FIGS. 5 and 6, or in FIGS. 9 and 10 are given, and the explanations thereof are adequately omitted.

As shown in FIG. 13, the solar cell 70 comprises: a p-layer 41; an n-layer 42; an i-layer 31 disposed between the p-layer 41 and the n-layer 42; a p$^+$-layer 51 connected to the p-layer 41; a first electrode 14 connected to the p$^+$-layer 51; an n$^+$-layer 52 connected to the n-layer 42; and a second electrode 15 connected to the n$^+$-layer 52. The i-layer 31 is configured in a manner laminating a wall layer 31a; a barrier 31b; and a layer 31e provided with a wet layer 31c and a quantum dot 31d. The wall layer 31a is constituted by a first semiconductor; and the layer 31e is constituted by a second semiconductor having a band gap narrower than that of the first semiconductor. In the solar cell 70, a spacing between the adjacent layers 31e, 31e is configured to permit a carrier to be transferred by tunneling conduction. And a spacing between the adjacent layers 31a, 31a is configured to permit a carrier to be transferred by tunneling conduction.

In the solar cell 70, the quantum 31d is formed by a self-ordering process by employing the MBE method; and is formed in the wet layer 31c. Each of the barriers 31b, 31b, . . . is disposed between the layers 31e, 31e, . . . and the wall layers 31a, 31a, . . . , which are disposed in the middle of the i-layer 31 in the thickness direction thereof (i.e. a direction from the top to the bottom of the sheet of FIG. 13). And the barrier 31b is constituted by a material (a semiconductor or insulator) having a band gap wider than that of the first semiconductor. In contrast, the barrier 31b is not disposed on the p-layer 41 side of the layer 31ep, and is not disposed on the n-layer 42 side of the layer 31en. Further, in the solar cell 70, an n-type impurity is contained in the wall layer 31ap; and a p-type impurity is contained in the wall layer 31an. In contrast, the n-type impurity and the p-type impurity are not contained in the region of the wall layer 31a other than the wall layer 31ap and the wall layer 31an. That is, when a concentration of the n-type impurity in the middle of the i-layer 31 in a thickness direction thereof is defined as Cn71, a concentration of the n-type impurity contained in a region on the p-layer 41 side of the i-layer 31 is defined as Cn72, a concentration of the p-type impurity in the middle of the i-layer 31 in the thickness direction thereof is defined as Cp71, and a concentration of the p-type impurity contained in a region on the n-layer 42 side of the i-layer 31 is defined as Cp72, the relations Cn71<Cn72 and Cp71<Cp72 are satisfied in the solar cell 70.

Figure 14:
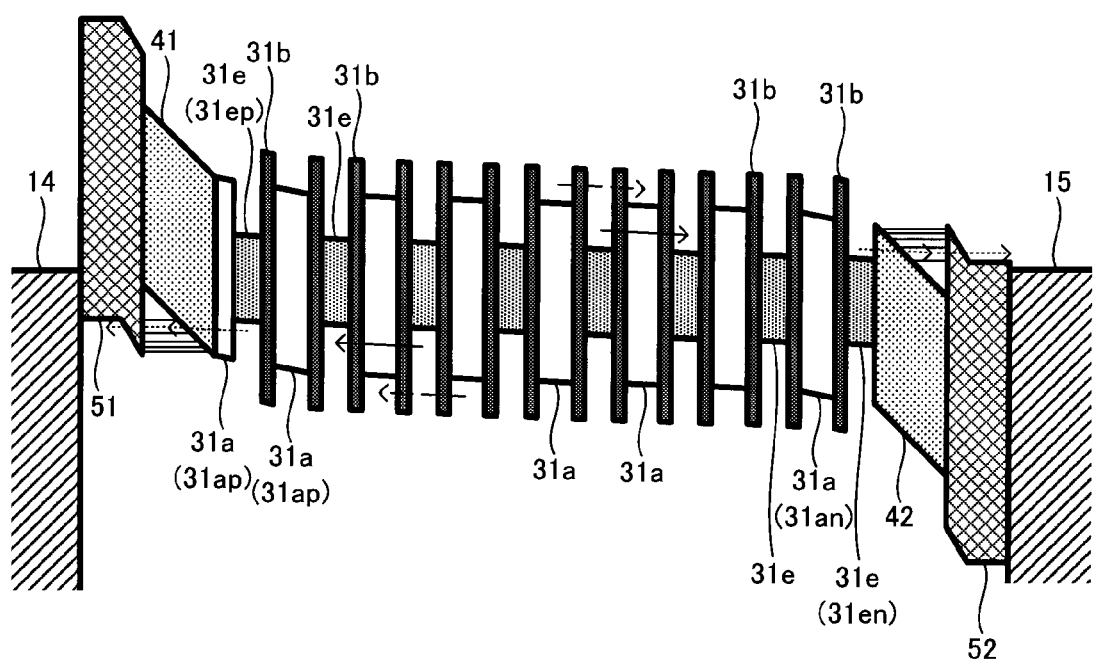
FIG. 14 is a band diagram showing the solar cell 70.

FIG. 14 is a band diagram of the solar cell 70. The energy of an electron is higher on the upper side of the sheet of FIG. 14, and the energy of a hole is higher on the lower side of the sheet of FIG. 14. In FIG. 14, the reference numerals corresponding to each element of the solar cell 70 are given, and some of the numerals are omitted. In FIG. 14, the arrow from the left side of the sheet to the right side shows a traveling pattern of an electron; and the arrow from the right side of the sheet to the left side shows a traveling pattern of a hole. Hereinafter, the explanations of the solar cell 70 will be continued with reference to FIGS. 9, 10, 13 and 14.

As shown in FIG. 14, in the solar cell 70, an internal electric field is generated by the p-layer 41 and the n-layer 42, and the band is inclined. And the band inclination of the i-layer 31, in other words, the band inclination of the wall layer 31a and the band inclination of the layer 31e (the band inclination of the wet layer 31c and the quantum dot 31d) are made gentle by the n-type impurity contained in the wall layer 31ap and by the p-type impurity contained in the wall layer 31an. In addition, as shown in FIG. 14, in the solar cell 70, a bad gap of a material constituting the barrier 31b is wider than that of the first semiconductor constituting the wall layer 31a. There is a gap between the lower end of the conduction band in the barrier 31b and the lower end of the conduction band in the wall layer 31a; and between the upper end of the valence band in the barrier 31b and the upper end of the valence band in the wall layer 31a. And there is a gap between the lower end of the conduction band in the barrier 31b and the lower end of the conduction band in the layer 31e; and between the upper end of the valence band in the barrier 31b and the upper end of the valence band in the layer 31e. These gaps are larger than the thermal energy which the carrier absorbs under the temperature environment where the solar cell 70 is used; and have a height at which to enable the carrier generated in the layer 31e to be transferred between the adjacent layers 31e, 31e by tunneling conduction.

In the solar cell 70, when the light is made incident upon the i-layer 31, an electron-hole pair is generated in both the wall layer 31a and the layer 31e (the wet layer 31c and the quantum dot 31d). Herein, as described above, the gap between the wall layer 31a and the barrier 31b is larger than the thermal energy which the carrier absorbs. Thus, when the carrier generated in the wall layer 31a moves in the middle portion of the i-layer 31 in the thickness direction thereof, the barrier 31b prevents the carrier from falling into the layer 31e (the wet layer 31c and the quantum dot 31d). Consequently, the carrier can drift inside the wall layer 31a sandwiched by the barriers 31b, 31b; and can pass through the laminate of the barrier 31b and the layer 31e disposed in the middle portion of the i-layer 31 in the thickness direction thereof, by tunneling conduction. In this manner, the hole having reached the end portion on the p-layer 41 side of the i-layer 31 (i.e. the layer 31ap in contact with the p-layer 41) moves directly to the quantum level formed in the valence band of the p-layer 41. By contrast, the electron having reached the layer 31an passes through the barrier 31b and the layer 31en and moves to the quantum level formed in the conduction band of the n-layer 42 by tunneling conduction. On the other hand, the carrier generated in the layer 31e moves among the layers 31e, 31e . . . , by tunneling conduction, the hole reaching the layer 31ep, and the electron reaching the layer 31en.

As shown in FIGS. 13 and 14, in the solar cell 70, the barrier 31b is not disposed between the layer 31ep and the p-layer 41, and between the layer 31en and the n-layer 42.

Further, the band inclination of the upper end of the valence band in the p-layer 41 and the band inclination of the conduction band in the n-layer 42 are steep. Hence, the hole existing in the layer 31ep can be transferred to the quantum level formed in the valence band of the p-layer 41 by tunneling conduction, without being obstructed by the barrier 31b. Likewise, the electron existing in the layer 31en can be transferred to the quantum level formed in the conduction band of the n-layer 42 by tunneling conduction, without being obstructed by the barrier 31b. In this way, in the solar cell 70 provided with the layer 31ep and the layer 31en, by making the band inclinations of the p-layer and the n-layer 42 steep, it is possible to easily take out the carrier from the layer 31ep and the layer 31en, which are constituted by the wet layer 31c and the quantum dot 31d. Herein, as shown in FIG. 14, the band inclination of the upper end of the valence band on the p-layer 41 side of the $p^+$-layer 51, and the band inclination of the conduction band on the n-layer 42 side of the $n^+$-layer 52 are steep. Hence, the hole having moved to the quantum level formed in the valence band of the p-layer 41 can be transferred to the $p^+$-layer 51 by tunneling conduction; and the electron having moved to the quantum level formed in the conduction band of the n-layer 42 can be transferred to the $n^+$-layer 52 by tunneling conduction.

In this way, in the solar cell 70, by making the band inclinations of the upper end of the valence band in the p-layer 41 and the $p^+$-layer 51 steep, it is possible to easily transfer the hole by tunneling conduction; and by making the band inclinations of the lower end of the conduction band in the n-layer 42 and the $n^+$-layer 52 steep, it is possible to easily transfer the electron by tunneling conduction. Further, in the solar cell 70, the triangular potential is formed in the valence band of the p-layer 41 and the ground quantum level of the triangular potential is approximately equal to the energy level at the upper end of the valence band of the end face on the first electrode 14 side of the $p^+$-layer 51; thereby the energy loss of the hole caused at a time when the hole moves to the first electrode 14 is reduced. In addition, in the solar cell 70, the triangular potential is formed in the conduction band of the n-layer 42 and the ground quantum level of the triangular potential is approximately equal to the energy level at the lower end of the conduction band of the end face on the second electrode 15 side of the $n^+$-layer 52; thereby the energy loss of the electron caused at a time when the electron moves to the second electrode 15 is reduced. By making it possible to easily take out the carrier from the wet layer or the quantum dot, and by reducing the energy loss, the photoelectric conversion efficiency can be improved. Therefore, according to the present invention, it is possible to provide the solar cell 70 which is capable of improving the photoelectric conversion efficiency.

In the above description related to the solar cell of the present invention, in which the triangular potential having the quantum level is formed, the embodiment has been shown in which the triangular potential having the quantum level in the valence band of the p-layer and in the conduction band of the n-layer. However, the solar cell of the present invention is not limited to this embodiment. In the solar cell of the present invention, the triangular potential having the quantum level may be formed only in the valence band of the p-layer by disposing the $p^+$-layer between the p-layer and the first electrode but not disposing the $n^+$-layer between the n-layer and the second electrode. Further, the triangular potential having the quantum level may be formed only in the conduction band of the n-layer by not disposing the $p^+$-layer between the p-layer and the first electrode but by disposing the $n^+$-layer between the n-layer and the second electrode. However, by forming the triangular potential having the quantum level, it is possible to reduce the energy loss of the carrier, thereby enabling improvement of the photoelectric conversion efficiency. Therefore, in order to provide a solar cell which is capable of easily improving the photoelectric conversion efficiency, the solar cell in which the triangular potential having the quantum level is formed in the valence band of the p-layer and the conduction band of the n-layer is preferred.

Further, in the above description related to the solar cell of the present invention, in which the triangular potential having the quantum level is formed, the embodiment has been shown in which the ground quantum level of the triangular potential formed in the valence band of the p-layer is approximately equal to the energy level at the upper end of the valence band of the end face on the first electrode side of the $p^+$-layer. However, the solar cell of the present invention is not limited to this embodiment. In the solar cell of the present invention, among the quantum levels of the triangular potential formed in the valence band of the p-layer, the quantum level having higher energy than the ground level may be approximately equal to the energy level at the upper end of the valence band of the end face on the first electrode side of the $p^+$-layer. In addition, none of the quantum levels of the triangular potential formed in the valence band of the p-layer may be equal to the energy level at the upper end of the valence band of the end face on the first electrode side of the $p^+$-layer. Further, in the above description related to the solar cell of the present invention, in which the triangular potential having the quantum level is formed, the embodiment has been shown in which the ground quantum level of the triangular potential formed in the conduction band of the n-layer is approximately equal to the energy level at the lower end of the conduction band of the end face on the second electrode side of the $n^+$-layer. However, the solar cell of the present invention is not limited to this embodiment. In the solar cell of the present invention, among the quantum levels of the triangular potential formed in the conduction band of the n-layer, the quantum level having higher energy than the ground level may be approximately equal to the energy level at the lower end of the conduction band of the end face on the second electrode side of the $n^+$-layer. In addition, none of the quantum levels of the triangular potential formed in the conduction band of the n-layer may be equal to the energy level at the lower end of the conduction band of the end face on the second electrode side of the $n^+$-layer.

Further, in the above description related to the solar cell of the present invention, in which the triangular potential having the quantum level is formed, the embodiment has been shown in which the solar cell comprises: the $p^+$-layer constituted by the material having a band gap wider than that of the material constituting the p-layer; and the $n^+$-layer constituted by the material having a band gap wider than that of the material constituting the n-layer, to which the solar cell of the present invention is not limited to. However, in view of inhibiting the electron as the minority carrier from moving to the first electrode, the $p^+$-layer constituted by the material having a band gap wider than that of the material constituting the p-layer is preferably provided. In addition, in view of inhibiting the hole as the minority carrier from moving to the second electrode, the $n^+$-layer constituted by the material having a band gap wider than that of the material constituting the n-layer is preferably provided.

Further, in the above description related to the solar cell of the present invention, the embodiment has been shown in which the relations Cn1<Cn2 and Cp1<Cp2 are satisfied by containing the n-type impurity in the end portion on the p-layer side of the i-layer, and by containing the p-type impurity in the end portion on the n-layer side of the i-layer. However, the solar cell of the present invention is not limited to this embodiment. The solar cell of the present invention may have a configuration in which the relation Cn1<Cn2 is satisfied only by containing the n-type impurity in the end portion on the p-layer side of the i-layer, and by not containing the p-type impurity in the end portion on the n-layer side of the i-layer. Or, the solar cell of the present invention may have a configuration in which the relation Cp1<Cp2 is satisfied only by containing the p-type impurity in the end portion on the n-layer side of the i-layer, and by not containing the n-type impurity in the end portion on the p-layer side of the i-layer. However, in view of easily improving the photo electric conversion efficiency, the relations Cn1<Cn2 and Cp1<Cp2 are preferably satisfied by containing the n-type impurity in the end portion on the p-layer side of the i-layer, and by containing the p-type impurity in the end portion on the n-layer side of the i-layer. Furthermore, in the solar cell of the present invention, the n-type impurity may be contained in the entire region on the p-layer side of the i-layer including the end portion on the p-layer side of the i-layer; and the p-type impurity may be contained in the entire region on the n-layer side of the i-layer including the end portion on the n-layer side of the i-layer. In the present invention, the degree to which the band inclination of the i-layer is made gentle can be adjusted by controlling the concentration and thickness of the n-type impurity and the p-type impurity to be contained in the i-layer. In the present invention, the band of the i-layer is preferably gently-inclined so that the energy difference between the quantum levels of the adjacent quantum structures becomes small.

Further, in the above description related to the solar cells 30, 70, the embodiment in which the quantum dot is formed on the p-layer side of the wet layer, to which the solar cell of the present invention is not limited. In the solar cell of the present invention, the p-layer and the n-layer of the solar cells 30, 70 may be replaced.

Furthermore, in the solar cell of the present invention, the band gap of the semiconductor constituting the p-layer and the band gap of the semiconductor constituting the n-layer are not particularly restricted. However, in view of providing a solar cell in which the hole can be easily taken out from the quantum structure portion disposed in the end portion on the p-layer side of the i-layer, the p-layer is preferably constituted by the semiconductor having a band gap which is between the band gap of the first semiconductor and that of the second semiconductor. From the same viewpoint, the n-layer is preferably constituted by the semiconductor having a band gap which is between the band gap of the first semiconductor and that of the second semiconductor.

Moreover, in the above description related to the solar cell of the present invention, the embodiment in which the quantum structure portion is the quantum dot has been shown, to which the solar cell of the present invention is not limited. The solar cell of the present invention may have an embodiment in which a quantum well or a quantum wire is used in the –i-layer. When the quantum wire is used as the quantum structure portion of the present invention, for example, a solar cell in which the quantum wire is disposed in the i-layer so that the axial direction of the quantum wire intersects the electric current/voltage direction of the i-layer, may be illustrated by the cross section similar to that shown in FIG. 1. In the present invention, when the quantum wire is used as the quantum structure portion, the material and structure for constituting the quantum wire are not particularly limited; a known quantum wire such as carbon nanotube may be used. Additionally, when using the quantum well as the quantum structure portion, the quantum well may be disposed in the same manner as the wet layer 31c of the solar cell 30 and the solar cell 70.

As seen above, a case in which the present invention is applied to a solar cell has been described; however, the application of the photoelectric conversion device of present the invention is not limited to the solar cell. The present invention can also be applied to other photoelectric conversion devices such as a photodetecting device

INDUSTRIAL APPLICABILITY

The photoelectric conversion device of the present invention can be used for, for example, a power source of electric vehicles and a photovoltaic system.

The invention claimed is:

1. A photoelectric conversion device comprising:
 a p-layer;
 an n-layer;
 an i-layer disposed between the p-layer and the n-layer, the i-layer comprising:
  a wall layer including a first semiconductor; and
  a quantum structure portion including a second semiconductor and disposed in the wall layer,
  wherein:
   a band gap of the first semiconductor is wider than a band gap of the second semiconductor,
   at least one of a first region on an n-layer side of the i-layer contains a p-type impurity or a second region on a p-layer side of the i-layer contains an n-type impurity,
   in a case where the first region contains the p-type impurity, a relation Cp1<Cp2 is satisfied, where Cp1 denotes a concentration of the p-type impurity at a middle of the i-layer in a thickness direction of the i-layer, and Cp2 denotes a concentration of the p-type impurity in the first region, and
   in a case where the second region contains the n-type impurity, a relation Cn1<Cn2 is satisfied, where Cn1 denotes a concentration of the n-type impurity at the middle of the i-layer in the thickness direction, and Cn2 denotes a concentration of the n-type impurity in the second region;
 a first electrode connected to the p-layer;
 a second electrode connected to the n-layer; and
 at least one of a first insulating layer disposed between the p-layer and the first electrode or a second insulating layer disposed between the n-layer and the second electrode.

2. The photoelectric conversion device according to claim 1, wherein the first region is provided in an end portion on the n-layer side of the i-layer.

3. The photoelectric conversion device according to claim 2, wherein the Cp2 and a concentration of the n-type impurity in the n-layer are controlled so as to allow an electron to transfer from the quantum structure portion contained in the end portion on the n-layer side of the i-layer to the n-layer by tunneling conduction.

4. The photoelectric conversion device according to claim 3, wherein an energy level at a lower end of a conduction band of an end face on a second electrode side of the n-layer is at or below a ground level of the quantum structure portion contained in the end portion on the n-layer side of the i-layer.

5. The photoelectric conversion device according to claim 1, further comprising:
 an $n^+$-layer disposed between the n-layer and the second electrode, wherein:
    an energy level at a lower end of a conduction band of an end face on an n-layer side of the $n^+$-layer is higher than an energy level at a lower end of a conduction band of an end face on an $n^+$-layer side of the n-layer, and a triangular potential having a quantum level is formed in the conduction band of the n-layer by disposing the $n^+$-layer.

6. The photoelectric conversion device according to claim 5, wherein the quantum level is approximately equal to an energy level at a lower end of a conduction band of an end face on a second electrode side of the $n^+$-layer.

7. The photoelectric conversion device according to claim 1, wherein the second region is provided in an end portion on the p-layer side of the i-layer.

8. The photoelectric conversion device according to claim 7, wherein the Cn2 and a concentration of the p-type impurity in the p-layer are controlled so as to allow a hole to transfer from the quantum structure portion contained in the end portion on the p-layer side of the i-layer to the p-layer by tunneling conduction.

9. The photoelectric conversion device according to claim 8, wherein an energy level at an upper end of a valence band of an end face on a first electrode side of the p-layer is at or above a ground level of the quantum structure portion contained in the end portion on the p-layer side of the i-layer.

10. The photoelectric conversion device according to claim 7, further comprising:
    a $p^+$-layer disposed between the p-layer and the first electrode,
    wherein:
        an energy level at an upper end of a valence band of an end face on a p-layer side of the $p^+$-layer is lower than an energy level at an upper end of a valence band of an end face on a $p^+$-layer side of the p-layer, and
        a triangular potential having a quantum level is formed in the valence band of the p-layer by disposing the $p^+$-layer.

11. The photoelectric conversion device according to claim 10, wherein the quantum level is approximately equal to an energy level at an upper end of a valence band of the an face on a first electrode side of the $p^+$-layer.

\* \* \* \* \*